US00RE38403E

(19) United States
(12) Reissued Patent
Sasaya et al.

(10) Patent Number: US RE38,403 E
(45) Date of Reissued Patent: Jan. 27, 2004

(54) PROJECTION OPTICAL SYSTEM AND PROJECTION EXPOSURE APPARATUS

(75) Inventors: Toshihiro Sasaya, Yokohama (JP); Kazuo Ushida, Tokyo (JP); Yutaka Suenaga, Yokohama (JP); Romeo I. Mercado, Fremont, CA (US)

(73) Assignee: Nikon Corporation, Tokyo (JP)

(21) Appl. No.: 09/659,376

(22) Filed: Sep. 8, 2000

Related U.S. Patent Documents

Reissue of:
(64) Patent No.: 5,805,344
Issued: Sep. 8, 1998
Appl. No.: 08/729,096
Filed: Oct. 11, 1996

U.S. Applications:
(63) Continuation of application No. 08/337,647, filed on Nov. 10, 1994, now abandoned.

(51) Int. Cl.[7] ..... G02B 13/04; G02B 13/22
(52) U.S. Cl. ..... 359/649; 359/651; 359/663; 359/754
(58) Field of Search ..... 359/649, 650, 359/651, 663, 754

(56) References Cited

U.S. PATENT DOCUMENTS

| | | | |
|---|---|---|---|
| 3,504,961 | A | 4/1970 | Hoogland et al. |
| 3,685,884 | A | 8/1972 | Harada |
| 3,737,215 | A | 6/1973 | De Jager |

(List continued on next page.)

FOREIGN PATENT DOCUMENTS

| | | |
|---|---|---|
| DE | 19726058 A | 1/1998 |
| EP | 0 243 950 | 11/1987 |
| EP | 0712019 | 5/1996 |

(List continued on next page.)

OTHER PUBLICATIONS

Japanese Publication No. 64–019317 (Jan. 1989) (Abstract only).
Japanese Publication No. 55–012902 (Jan. 29, 1980) (Abstract Only).
U.S. patent application Ser. No. 09/665,184, Tomowaki Takahashi, Nikon Corporation, Japan, filed Sep. 5, 2000.
U.S. patent application Ser. No. 09/766,486, Tomowaki Takahashi, Nikon Corporation, Japan, filed Jan. 19, 2001.

(List continued on next page.)

*Primary Examiner*—Scott J. Sugarman

(57) ABSTRACT

In the projection optical system that projects an image of the first object onto the second object with a fixed reduction ratio and a projection aligner equipped therewith, said projection optical system comprises, viewed from said first object side, in order of succession, the first group of lenses with positive refractive power, and the second group of lenses virtually consists of afocal system, and the third group of lens with positive refractive power, and if the focal length of the overall system is represented by F, the projection magnification ratio of said projection optical system is represented by B, the distance between said first object and said second object is represented by L, and when a ray from the second object side of said projection optical system that is parallel to the optical axis of said projection optical system is incident on said projection optical system, a distance between a point where an extension on the first object side of said ray intercepts the optical axis and said first object plane is represented by e, and a height of said ray on said first object from the optical axis of said projection optical system, when said ray, coming through said projection optical system, reaches said first object is represented by h, then the following conditions should be satisfied:

$$1.8 \leqq |F/(B \cdot L)|$$

$$|h/e| \leqq 3/1000.$$

207 Claims, 18 Drawing Sheets

U.S. PATENT DOCUMENTS

| | | | | |
|---|---|---|---|---|
| 3,897,138 | A | | 7/1975 | Kano |
| 3,909,115 | A | | 9/1975 | Kano |
| 3,955,883 | A | | 5/1976 | Sugiyama |
| 4,080,048 | A | | 3/1978 | Kimura |
| 4,386,828 | A | * | 6/1983 | Hirose |
| 4,497,015 | A | | 1/1985 | Konno et al. |
| 4,592,625 | A | * | 6/1986 | Uehara et al. |
| 4,666,273 | A | | 5/1987 | Shimizu et al. |
| 4,685,777 | A | | 8/1987 | Hirose |
| 4,701,035 | A | | 10/1987 | Hirose |
| 4,747,678 | A | | 5/1988 | Shafer et al. |
| 4,770,477 | A | | 9/1988 | Shafer |
| 4,772,107 | A | | 9/1988 | Friedman |
| 4,779,966 | A | | 10/1988 | Friedman |
| 4,812,028 | A | | 3/1989 | Matsumoto |
| 4,851,978 | A | * | 7/1989 | Ichihara ..... 359/619 |
| 4,867,545 | A | | 9/1989 | Wakimoto et al. |
| 4,906,080 | A | | 3/1990 | Omata |
| 4,929,066 | A | | 5/1990 | Wakimoto et al. |
| 4,948,238 | A | | 8/1990 | Araki |
| 4,953,960 | A | | 9/1990 | Williamson |
| 4,974,919 | A | * | 12/1990 | Muraki et al. ..... 359/618 |
| 5,052,763 | A | | 10/1991 | Singh et al. |
| 5,089,913 | A | | 2/1992 | Singh et al. |
| 5,170,207 | A | | 12/1992 | Tezuka et al. |
| 5,194,893 | A | | 3/1993 | Nishi |
| 5,212,593 | A | | 5/1993 | Williamson et al. |
| 5,220,454 | A | | 6/1993 | Ichihara et al. |
| 5,241,423 | A | | 8/1993 | Chiu et al. |
| 5,253,110 | A | | 10/1993 | Ichihara et al. |
| 5,258,777 | A | | 11/1993 | DeJager et al. |
| 5,260,832 | A | * | 11/1993 | Togino et al. |
| 5,272,568 | A | | 12/1993 | DeJager |
| 5,274,503 | A | | 12/1993 | DeJager |
| 5,323,263 | A | | 6/1994 | Schoemakers |
| 5,333,035 | A | | 7/1994 | Shiraishi |
| 5,365,051 | A | | 11/1994 | Suzuki et al. |
| 5,402,267 | A | | 3/1995 | Furter et al. |
| 5,406,415 | A | | 4/1995 | Kelly |
| 5,414,551 | A | * | 5/1995 | Okazaki et al. ..... 359/744 |
| 5,414,561 | A | | 5/1995 | Wakimoto et al. |
| 5,448,408 | A | * | 9/1995 | Togino et al. |
| 5,506,684 | A | | 4/1996 | Ota et al. |
| 5,515,207 | A | | 5/1996 | Foo |
| 5,534,970 | A | | 7/1996 | Nakashima et al. |
| 5,537,260 | A | | 7/1996 | Williamson |
| 5,583,696 | A | | 12/1996 | Takahashi |
| 5,591,958 | A | | 1/1997 | Nishi et al. |
| 5,592,329 | A | | 1/1997 | Ishiyama et al. |
| 5,623,365 | A | | 4/1997 | Kuba |
| 5,636,000 | A | | 6/1997 | Ushida et al. |
| 5,636,066 | A | | 6/1997 | Takahashi |
| 5,668,673 | A | | 9/1997 | Suenaga et al. |
| 5,689,377 | A | | 11/1997 | Takahashi |
| 5,691,802 | A | | 11/1997 | Takahashi |
| 5,694,241 | A | | 12/1997 | Ishiyama et al. |
| 5,706,137 | A | | 1/1998 | Kelly |
| 5,742,436 | A | | 4/1998 | Furter |
| 5,808,805 | A | | 9/1998 | Takahashi |
| 5,831,776 | A | | 11/1998 | Sasaya et al. |
| 5,943,172 | A | | 8/1999 | Sasaya et al. |

FOREIGN PATENT DOCUMENTS

| | | | | |
|---|---|---|---|---|
| EP | 0717299 | | 6/1996 | |
| EP | 0736789 | A | 10/1996 | |
| EP | 0770895 | | 5/1997 | |
| EP | 0243950 | | 11/1997 | |
| EP | 0 243 950 | A2 | 11/1997 | ..... G02B/27/18 |
| JP | 47-35017 | | 9/1972 | |
| JP | 55-12902 | | 1/1980 | |
| JP | 58-04112 | | 1/1983 | |
| JP | 0078115 | | 5/1983 | |
| JP | 58-078115 | | 5/1983 | |
| JP | 61-156737 | | 7/1986 | |
| JP | 63-118115 | | 5/1988 | |
| JP | 63-163319 | | 7/1988 | |
| JP | 0019317 | | 1/1989 | |
| JP | 64-019317 | | 1/1989 | |
| JP | 2-66510 | | 3/1990 | |
| JP | 3-282527 | | 12/1991 | |
| JP | 4-42208 | | 2/1992 | |
| JP | 404042208 | | 2/1992 | |
| JP | 4-157412 | | 5/1992 | |
| JP | 4-234722 | | 8/1992 | |
| JP | 05-034593 | | 2/1993 | |
| JP | 5-72478 | | 3/1993 | |
| JP | 5-173065 | | 7/1993 | |
| JP | 05-173065 | | 7/1993 | |
| JP | 6-313845 | | 11/1994 | |
| JP | 07-140384 | | 6/1995 | |
| JP | 07140384 | | 6/1995 | |
| JP | 07 140 384 | A | 6/1995 | ..... G02B/13/24 |
| JP | 07140385 | | 6/1995 | |
| JP | 07-140385 | | 6/1995 | |
| JP | 07 140 385 | A | 6/1995 | ..... G02B/13/14 |
| WO | 93/04391 | | 3/1993 | |

OTHER PUBLICATIONS

U.S. patent application Ser. No. 09/764,157, Tomowaki Takahashi, Nikon Corporation, Japan, filed Jan. 19, 2001.

U.S. patent application Ser. No. 09/709,518, Hitoshi Matsuzawa, et al., Nikon Corporation, Japan, filed Nov. 13, 2000.

U.S. patent application Ser. No. 09/659,375, Tomowaki Takahashi, Nikon Corporation, Japan, filed Sep. 8, 2000.

* cited by examiner

PROJECTION OPTICAL SYSTEM AND PROJECTION EXPOSURE APPARATUS

Matter enclosed in heavy brackets [ ] appears in the original patent but forms no part of this reissue specification; matter printed in italics indicates the additions made by reissue.

This is a continuation of application Ser. No. 08/337,647, filed Nov. 10, 1994, now abandoned.

BACKGROUND OF THE INVENTION

1. Field of the Invention

The present invention generally relates to projection optical systems as well as projection aligners used for reducing and projecting patterns on the first object onto the second object such as a substrate, and particularly relates to projection optical systems as well as projection aligners which are ideal for projection alignment of integrated circuit patterns formed on a reticle (mask) as the first object onto a substrate (wafer) as the second object.

2. Related Background Art

As integrated circuit patterns become more refined, projection optical systems used for wafer printing are required to have still more higher performance. Under such circumstances, in order to improve resolution of projection optical systems, it can be considered either to further shorten an exposure wavelength $\lambda$ or to increase a numerical aperture (NA) of projection optical systems.

In recent years, in order to accommodate further refinement of print patterns, a light source to be used for exposure is being substituted from the one that emits g line (436 nm) ray to mainly the one that emits i line (365 nm) ray. Furthermore, a light source that emits light with shorter wavelength, such as excimer laser (248 nm, 193 nm), is about to be used.

And a projection optical system which performs projection alignment of a pattern on a reticle onto a wafer by use of the aforementioned various exposure wavelengths is being proposed.

A projection optical system is required to reduce image distortion as well as to improve resolution. What is termed as "image distortion" herein are, besides the image distortion (distortion) a projection optical system has, the one due to curvature of a wafer to be imaged thereon on the image side of a projection optical system and the one due to curvature of a reticle on the object side of the projection optical system on which IC patterns and such are drawn. In recent years, print patterns are becoming even more refined, and the requirement for decreasing image distortion is becoming more severe.

In order to diminish an influence of wafer curvature upon image distortion, an optical system whose image side is made nearly telecentric which places an exit pupil position far from an image position has been used.

Meanwhile, with regard to reduction of image distortion caused by reticle curvature, an optical system that places an entrance pupil position of a projection optical system relatively far from an object plane whose object side is made nearly telecentric has been considered, and such a projection optical system has been proposed. Some of such examples are set forth in Patent Disclosure Showa #63-118115, Patent Disclosure Heisei #4-157412, and Patent Disclosure Heisei #5-173065.

The projection optical systems proposed in each of the above mentioned Patent public information, however, had small numerical apertures (NA) and insufficient resolution, or had narrow exposure areas. Furthermore, in spite of more severe requirement to reduce image distortion, all it has been done in the above reference patents was to simply place an entrance pupil position of the projection optical systems relatively farther from the object plane (reticle), and the deviation from a fully telecentric system (hereinafter called "deviation from telecentricity") on the object side as well as the image side (wafer side) was so large that is was insufficient to accommodate further refinement of print patterns.

Also, if deviation from telecentricity on the object side (reticle side) is large, an illumination light for illuminating a reticle uniformly needs to enter in the manner that the influence of said deviation from telecentricity is compensated by the illumination optical system. Therefore, it has been extremely difficult to design an illumination optical system to be installed in an aligner.

The present invention was accomplished with the foregoing in mind, and an object of this invention is, while maintaining a comparatively large exposure area, to provide a projection optical system with high resolution and a large numerical aperture with small constraint to the illumination optical system, whose deviation from telecentricity on the object side as well as the image side is extremely small even when the flatness of the first object (reticle) as well as the second object (wafer) is unfavorable, so as to be able to obtain substantially small image distortion, and to provide a projection aligner provided therewith.

SUMMARY OF THE INVENTION

One aspect of the present invention for the purpose of achieving the aforementioned object is a projection optical system that projects an image of a first object with fixed reduced magnification onto a second object, and it comprises, viewed from said first object side, in order of succession, a first group of lenses with positive refractive power G1, a second group of lenses G2 virtually constituted by afocal systems, and a third group of lenses G3 with positive refractive power, and if a focal length of the overall system is represented by F, projection magnification of said projection optical system is represented by B, a distance between said first object and said second object is represented by L, a distance from an entrance pupil position of said projection optical system or a position where an extension of an incident ray from an object intersects an optical axis (hereinafter called "an incident point position corresponding to a finite object height" for convenience) that can be found when a ray from the second object side of said projection optical system that is parallel to the optical axis of said projection optical system is incident on said projection optical system to said first object plane is represented by e, and a height of said ray from the optical axis at said first object plane when said ray that determines an entrance pupil, or an incident point position corresponding to a finite object height of said projection optical system, passes through said projection optical system is represented by h, then it is constituted so as to satisfy the following conditions:

$$1.8 \leqq |F/(B \cdot L)| \qquad \text{(I)}$$

$$|h/e| \leqq 3/1000$$

A projection aligner, according to an other aspect of the present invention, comprises an illumination system that illuminates the first object on which a fixed pattern is formed, a projection optical system which projects the image of said first object onto the second object, the first supporting means which supports the first object, and the second supporting means which supports the second object, and said projection optical system thereof comprises, viewed from said first object side, in order of succession, the first group of lenses G1 with positive refractive power, the second group of lenses G2 virtually constituted by afocal systems, and the third group of lenses G3 with positive refractive power, and when the focal length of the overall system is represented by F, the projection magnification of said projection optical system is represented by B, the distance between said first object and said second object is represented by L, the distance from an entrance pupil position of said projection optical system or an incident point position corresponding to a finite object height that can be found when a ray from the second object side of said projection optical system that is parallel to the optical axis of said projection optical system is incident on said projection optical system to said first object plane is represented by e, and the height of said ray from the optical axis at said first object plane when said ray that determines an entrance pupil position, or an incident point position corresponding to a finite object height of said projection optical system, passes through said projection optical system is represented by h, then it is constituted so as to satisfy the following conditions:

$$1.8 \leq |F/(B \cdot L)| \quad \text{(I)}$$

$$|h/e| \leq 3/1000$$

DESCRIPTION OF THE PREFERRED EMBODIMENT

First of all, before the present invention are described, a basic configuration as well as various preferred conditions thereof will be described.

Figure 1:
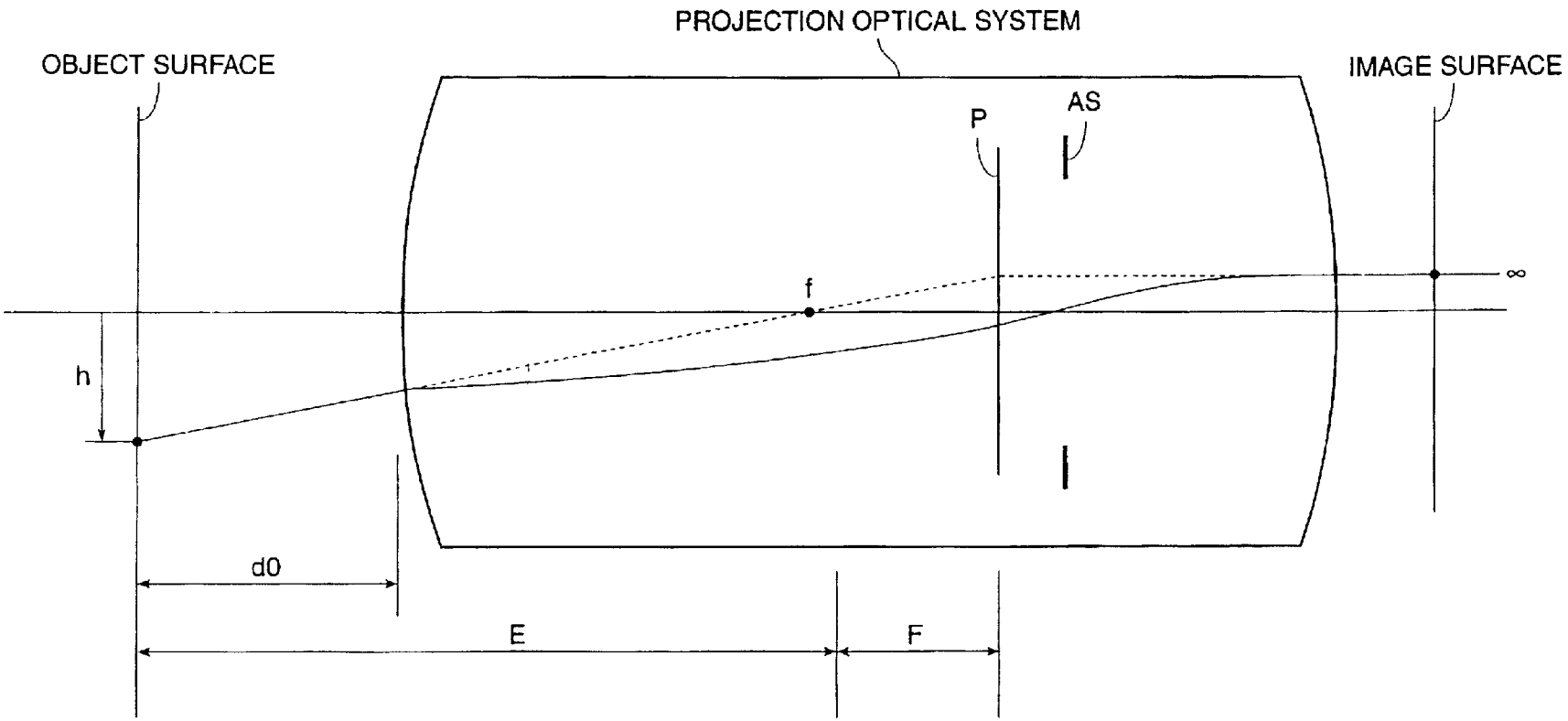
FIG. 1 is a conceptual drawing showing the projection optical system according to the present invention, wherein deviation from telecentricity on both the object side and the image side is small enough.

As shown in FIG. 1, an aperture stop AS is normally installed in a projection optical system. An entrance pupil position of a projection optical system can be found by paraxial ray tracing as an image position of AS by an optical system that is placed on the object side (reticle side) of its aperture stop AS.

However, an extension of a real principal ray (a ray that passes through the center of an aperture stop AS) of a ray bundle that emerges from the object height h does not exactly intersect the optical axis of the system at the paraxial entrance pupil position (so called pupil aberration). Here, the point where the extension of the principal ray on the object side of the ray bundle emerging from the object height h intercepts the optical axis will be called "the entrance pupil position corresponding to the object height h", and the point where the extension of the principal ray on the image side of the ray bundle emerging from the object height h intercepts the optical axis will be called "the exit pupil position corresponding to the object height h".

Meanwhile, the influence of the reticle curvature on the object side of a projection optical system upon the image distortion is proportionate to the deviation from telecentricity T of the incident ray bundle that is incident on a projection optical system from the reticle, i.e., an inclination of the principal ray of the incident ray bundle subtended by the optical axis of the projection optical system.

Now on a reticle, if deviation from telecentricity of the incident ray bundle (principal ray) from the point whose height from the optical axis is h (the object height h) is represented by T(h), a distance between the entrance pupil position corresponding to the object height h and the reticle is represented by E(h), then T(h) and E(h) are related by $$T(h)=H/E(h) \quad (1).$$

Therefore, in order to obtain constantly uniform deviation from telecentricity to make the influence upon the image distortion on the object side uniform, irrespective of the object height h, it would be sufficient to change an entrance pupil position corresponding to the object height h so as to be proportionate to the object height h. In other words, by placing an entrance pupil position corresponding to the object height h when the object height h is low to a position that is close to the object (reticle side) than the entrance pupil position corresponding to the object height h when the object height h is high, it will become possible to make an influence upon the image distortion on the object side nearly uniform.

In the present invention, although the entrance pupil position corresponding to the object height h generally varies depending on the object height, the fact that a degree of the influence of the entrance pupil position corresponding to the object height upon the image distortion also varies depending on the height of the object is being paid attention to, and by well balancing the entrance pupil positions according to the height of the object height h (the height from the optical axis on the reticle), it is made possible to make the influence upon the image distortion on the entire object plane uniform.

Condition (I), as shown below, provides for an optimal ratio of the focal length of the projection optical system F and imagery magnification of the projection optical system B, multiplied by the distance between the object and the image L (the distance between the reticle and the wafer).

$$1.8 \leqq |F/(B \cdot L)| \quad (I)$$

This condition (I) implies that it will be equivalent as providing for the ratio of the distance E from the object plane (reticle plane) to the entrance pupil of the projection optical system and the distance L between the object and the image (the distance from the reticle to the wafer), when the exit pupil position of the projection optical system on the image side (wafer side) is supposed to be at infinity.

Hence to describe it more concretely, as shown in FIG. 1, the primary focal point of the entire projection optical system f (a focal point on the reticle side) corresponds to the entrance pupil position, supposing the exit pupil position of the projection optical system is at infinity, and if the focal length of the overall projection optical system with P representing a primary principal plane of the projection optical system is represented by F, the projection magnification of the projection optical system is represented by B, the distance from the object plane (reticle plane) to the primary focal point of the entire projection optical system f is represented by E, then according to a lateral magnification equation, the following relation should be established.

$$B=F/E \quad (2)$$

And transforming the above mentioned Eq. (2) yields $$E=F/B \quad (3)$$

and dividing the both sides of Eq. (3) by the distance between the object and the image L (the distance between the reticle and the wafer), and taking its absolute value then finally derives Eq. (4) that accounts for the meaning of the above mentioned Condition (I).

$$|E/L|=|F/(B \cdot L)| \quad (4)$$

From the above, it can be understood that Condition (I) provides for the absolute value of the optimal ratio of the distance from the object plane (reticle plane) to the entrance pupil E and the distance between the object and the image L (the distance between the reticle and the wafer), supposing the exit pupil position of the projection optical system on the image side (wafer side) is at infinity.

At below the lower limit of Condition (I), the entrance pupil position of the projection optical system becomes too close to the object compared to the distance L between the object and the image (the distance between the reticle and the wafer) and the deviation from telecentricity over the entire object plane (entire reticle plane) will aggravate, and thus some difficulty is encountered in correcting the deviation from telecentricity. Furthermore, in order to uniformly and adequately reduce the influence upon the image distortion on the entire object plane, it is desirable to define Condition (I) as $6 \leqq |F/(B \cdot L)|$ with the lower limit of 6. This will make it possible to construct a type of projection optical system wherein the influence upon the image distortion by the deviation from telecentricity of the incident rays can be almost ignored, and this gives such an advantage wherein the necessity to compensate the deviation from telecentricity of incident rays is reduced, and the degree of freedom in designing the illumination system is increased. Furthermore, in order to reduce the deviation from telecentricity nearly to perfection and to substantially increase the degree of freedom in designing the illumination optical system, it is more preferable to define the above mentioned Condition (I) as $7.2 \leqq |F/(B \cdot L)|$ with the lower limit of 7.2.

Also, Condition (I) provides for an optimal entrance pupil position of the projection optical system in order to diminish the influence upon the image distortion on the image side, supposing the exit pupil position of the projection optical system on the image side (wafer side) is at infinity, but it also concurrently provides for the optimal exit pupil position of the projection optical system.

Hence to describe it concretely, supposing the entrance pupil position of the projection optical system on the object side (reticle side) is at infinity, if the distance from the exit pupil position of this projection optical system to the image field (wafer plane) is represented by E', then according to the lateral magnification equation, the following equation should hold.

$$1/B=F/E' \quad (5).$$

And transforming Eq. (5) derives the following Eq. (6).

$$E'=F \cdot B=(F/B) \cdot B^2 \quad (6)$$

Using the above mentioned Eq. (3), further transformation of the above mentioned Eq. (5) derives the following Eq. (7).

$$E=E \cdot B^2 \quad (7)$$

This Eq. (7) is equivalent to the right side of Eq. (3), multiplied by the square of the projection magnification B ($B^2$) of the projection optical system, and dividing the both sides of the above mentioned Eq. (7) by the distance between the object and the image L (the distance between the reticle and the wafer) and taking its absolute value derive the following Eq. (8).

$$|F \cdot B/L|=|[F/(B \cdot L)]| \cdot B^2 \quad (8)$$

This Eq. (8) is equivalent to the right side of the above mentioned Eq. (4) that accounts for the meaning of Condition (I) multiplied by the square of the projection magnification of the projection optical system $B(B^2)$, and applying the above to the aforementioned Condition (I) yields the following (9).

$$|F/(B\cdot L)|\cdot B^2 \geqq 1.8\cdot B^2 \quad (9)$$

Therefore, Condition (I) provides for the optimal entrance pupil position of the projection optical system, supposing the exit pupil position of the projection optical system is at infinity, and concurrently, by considering the amount of the entire Condition (I) multiplied by $B^2$, it can be understood that it also provides for the exit pupil position in order to diminish the influence upon the image distortion on the image side, supposing the entrance pupil position of the projection optical system is at infinity.

Therefore, the exit pupil position of the projection optical system on the image side (wafer side) as well as the entrance pupil position of the projection optical system on the object side (reticle side) do not have to be perfectly at infinity, but as long as it is within the range of Condition (I), it can be understood that it is possible to maintain the deviation from telecentricity on both the image side (wafer side) and the object side (reticle side) in a virtually well-balanced manner. Furthermore, in order to reduce the number of optical members (lenses, etc.) to constitute the projection optical system, while securing the degree of freedom in correcting aberration in the projection optical system, it is more preferable to define Condition (I) as $|F/(B\cdot L)| \leqq 22$ with the upper limit of 22.

In Condition II, an exit pupil position of the projection optical system is supposed to be at infinity, and the distance between said first object plane and an entrance pupil position or an incident point position corresponding to a finite object height on the first object side of the projection optical system, that is determined when a ray from the second object side that is parallel to an optical axis of said projection optical system is incident on said projection optical system, is represented by e, and a height of said ray from the optical axis of the projection optical system on a reticle, when said ray, coming through said projection optical system, determining the entrance pupil position or an incident point position corresponding to a finite object height on the first object side of said projection optical system, reaches said first object, is represented by h, the optimal distance e from the first object plane to the entrance pupil or the incident point position corresponding to the object height h is provided.

$$|h/e| \leqq 3/1000 \quad (II)$$

Said Condition (I) provides for, when the exit pupil position of the projection optical system on the image side (wafer side) is supposed to be at infinity, the optimal ratio between the distance E from the object plane (reticle plane) to the paraxial entrance pupil of the projection optical system, and the distance L between the object and the image (the distance from the reticle to wafer), but the entrance pupil position with respect to the finite object height h should also be taken into consideration in the projection optical system that has a limited exposure area in actuality. In particular, as print patterns become more refined and the requirement to reduce the image distortion is becoming more severe, Condition (II) along with Condition (I) needs to be satisfied.

h in Condition (II) could be in the range shown in Eq. (10), when the maximum height from the optical axis is H.

$$0 \leqq h \leqq H \quad (10)$$

Therefore, it becomes necessary that the object height h satisfies Condition (II) within the range of the Eq. (10), in other words, Condition (II) needs to be satisfied in the combination of h and e where $|h/e|$ is the maximum.

Furthermore, Condition (II) provides for the optimal entrance pupil position or the incident point position corresponding to the object height h of the projection optical system when the exit pupil position of the projection optical system on the image side (wafer side) is supposed to be at infinity, but similar to previously mentioned Condition (I), it also provides for the optimal exit pupil position of the projection optical system corresponding to the object height h.

Hence to describe it concretely, $|h/e|$ in Condition (II) corresponds to an inclination of the ray emerging from the object side (reticle side), with respect to the optical axis, of the projection optical system, when the exit pupil position of the projection optical system on the image side (wafer side) is supposed to be at infinity. At this time, in the case when the inclination of the emergence ray satisfies Condition (II), if a ray at the height (object height) h from the optical axis on the object plane (reticle plane) that is parallel to the optical axis of the projection optical system, i.e., a ray whose inclination with respect to the optical axis is zero, is incident on the projection optical system, the inclination $\alpha$ of the ray emerged from the optical system will be as follows:

$$\alpha \approx |h/(e\cdot B)| \quad (11)$$

This implies that the both sides of Condition (II) divided by B, that is, $$|h/(e\cdot B)| \leqq 3/(1000|B|) \quad (12),$$

provides for the exit pupil position or the emergence point position corresponding to the object height h when the entrance pupil position of the projection optical system is at infinity.

Therefore, it can be understood that, when the exit pupil position of the projection optical system is supposed to be at infinity, along with providing for the optimal incident point position to the projection optical system corresponding to an object height h. Condition (II) also provides for the emergence point position corresponding to the object height h at the time when the entrance pupil position of the projection optical system is supposed to be at infinity, by giving consideration to the amount of the entire Condition (II) divided by B. In other words, although it is similar to Condition (I) in the sense that the behaviour of a ray bundle on the entrance pupil side and the exit pupil side are concurrently taken into account, Condition (I) shows the fundamental condition where the paraxial ray tracing is used, whereas the Condition (II) further takes the finite object height h ($\leqq$H) into consideration.

At above the upper limit of Condition (II), either the entrance pupil position or the exit pupil position with respect to the finite object height h ($\leqq$H) is so close to the object plane or the image surface that some difficulty is encountered in compensating the deviation from telecentricity on the image side (wafer side) and the object side (reticle side) in a well-balanced manner. Within the range of the maximum object height H, satisfying Condition (II) makes it possible to construct a projection optical system where the influence of the deviation from telecentricity of the incident ray bundle as well as the emergence ray bundle upon the image distortion can be almost ignored, making it a projection optical system with remarkably small deviation from telecentricity.

Furthermore, Condition (III) as shown below, shows the optimal range of the ratio between the product of the maximum height H of the first object from the optical axis of the projection optical system and the projection magnification B of the projection optical system and the focal length F of the projection optical system.

$$|BH/F| \leqq 8/1000 \quad \text{(III)}$$

In Condition III, the entrance pupil position and the exit pupil position with respect to the finite image height h (≦H) are taken into consideration for the paraxial ray approach. In other words, when the exit pupil position of the projection optical system on the image side (wafer side) is assumed to be at infinity, according to the above mentioned Eq. (3), the distance from the object plane (reticle plane) to the entrance pupil E is F/B. Therefore, the quotient of the maximum object height H divided by this value, BH/F, is the inclination on the object side (reticle side) of the light flux incident on the projection optical system, given by the paraxial ray tracing, when the exit pupil position of the projection optical system on the image side (wafer side) is supposed to be at infinity, and it corresponds to the inclination of the principal ray of the ray bundle at the maximum object height H on the object side (reticle side) when there is no pupil aberration. What Condition (III) provides for with regard to this inclination implies defining aberration related to pupils with the paraxial ray tracing and obtaining an optical system with preferable imagery performance.

At above the upper limit of Condition (III), when the exit pupil position of the projection optical system is supposed to be at infinity, if the inclination of the principal ray of the ray bundle from the finite object height (≦H) that is incident on the projection optical system satisfies Condition (II), the inclination of the principal ray of the ray bundle that is provided for by the paraxial ray tracing will become significantly larger. This implies that an optical system whose character is not originally suitable to be an optical system with small deviation from telecentricity is being forced to improve its inclination of the principal ray of the ray bundle from the actual finite object height h that is incident on the projection optical system, making the optical system complicated more than necessary, rendering it to be not preferable. Furthermore, in order to realize a projection optical system whose deviation from telecentricity is small, while making it an optical system with less components, it is more preferable to define Condition (III) as $|BH/F| \leqq 6.5/1000$ with the upper limit of 6.5/1000.

Furthermore, in order to realize a projection optical system with sufficiently small deviation from telecentricity, it is desirable to satisfy the following Condition (IV):

$$|Fh/(BHe)| \leqq 4. \quad \text{(IV)}$$

Furthermore, based on the following equation, $$|Fh/(BHe)| = |h/e|/|BH/F| \quad (13),$$

Condition (IV) shows the ratio between Condition (II) that corresponds to the inclination of the principal ray of the ray bundle, that is incident on the projection optical system on the object side and Condition (III) that provides for it with the paraxial ray tracing. In other words, this Condition (IV) expresses to what extent it is preferable to allow Condition (II) when Condition (III) is controlled with the paraxial ray tracing to some extent, and provides for the optimal balance between by the paraxial ray tracing and the actual ray trace. At above this Condition (IV), even though it is a value defined with the paraxial ray tracing that was well-controlled, it means that the inclination of the principal ray of the ray bundle from the actual finite object height h that is incident on the projection optical system will be used in the worse condition than the paraxial evaluation, and is not preferable because the potential performance of the optical system is not fully utilized. Furthermore, in order to realize a projection optical system that can maintain desirable telecentricity, while being an optical system with less number of components, it is further preferable to define Condition (IV) as $|Fh/(BHe)| \leqq 2$ with the upper limit of 2.

Thus, satisfying above mentioned Condition (I) as well as (II) makes it possible to construct a projection optical system wherein the influence of deviation from telecentricity of both the incident ray bundle as well as the exit ray bundle can be almost ignored. Furthermore, satisfying Condition (III) that uses the paraxial ray tracing makes it possible to easily obtain a projection optical system with small deviation from telecentricity. Furthermore, satisfying Condition (IV) makes it possible to make it a projection optical system with small deviation from telecentricity, where the original potential performance of the optical system is fully utilized.

Furthermore, when the projection optical system is basically comprising, viewed from said first object side, in order of succession, a first group of lenses with positive refractive power, a second group of lenses virtually constituted by afocal system, and a third group of lenses with positive refractive power, it is desirable if the optimal ratio between the focal distance $f_1$ of the first group of lenses G1 and a focal length $f_3$ of the third group of lenses G3 is satisfied as shown below.

$$0.80 \leqq f_3/f_1 \leqq 1.5 \quad \text{(V)}$$

Figure 2:
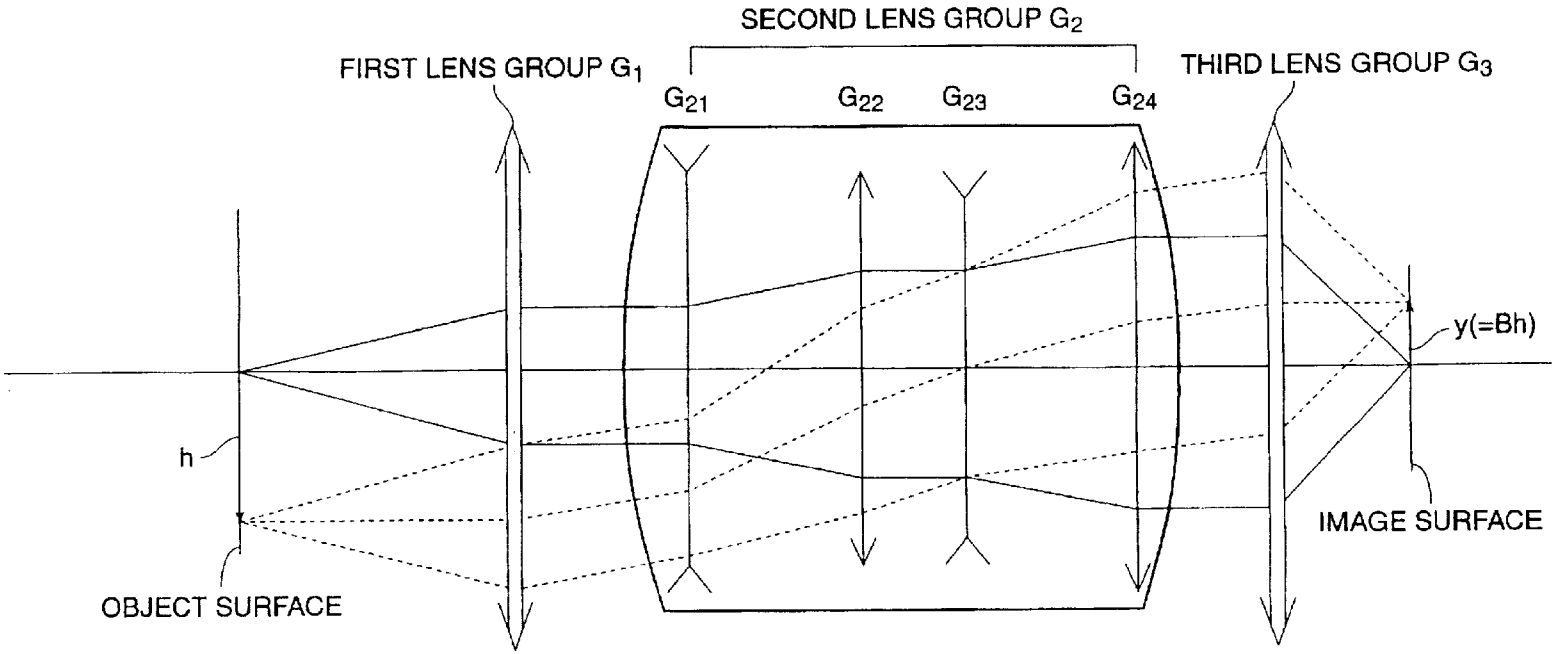
FIG. 2 shows a basic structure of the projection optical system according to the present invention.

This Condition (V) is for the purpose of attaining the projection optical system with high resolution, while maintaining a large exposure area and realizing a high numerical aperture (NA). In the following, a basic configuration of the projection optical system according to the present invention will be studied prior to explaining this condition. As shown in FIG. 2, the projection optical system according to the present invention basically comprises, viewed from the object side (reticle side), in order of succession, the first group of lenses G1 with positive refractive power, the second group of lenses G2 that substantially consists of the afocal system, and the third group of lenses G3 with positive refractive power. Furthermore in FIG. 2, a ray shown in a solid line from the position where the object height h on the object (reticle) is zero (a position where the reticle and the optical axis of the projection optical system intersect) indicates the paraxial marginal ray from the axial object point (the center of the object), and a ray shown in a dash from the position of the object height h (the height of the object h from the optical axis) indicates the paraxial marginal ray from an off-axis object point. What is designated as the paraxial marginal ray in the present invention is the peripheral (outer) incident ray, which was found by the paraxial ray tracing, when a ray emerged from an object point with a certain divergence angle is incident on the optical system.

In order to attain the projection optical system with high resolution, while maintaining the compactness thereof as well as the large exposure area based on the above mentioned lens configuration, it is necessary to correct aberration due to the angle of view or aberrations due to the object height H (aberration due to off axis rays such as image field curvature, astigmatic aberration, coma aberration, and distortion) and the aberration related to the numerical aperture NA on the image side of the projection optical system, namely, aberration related to resolution (aberration due to the axial rays such as spherical aberration) in a well balanced manner.

Figure 3:
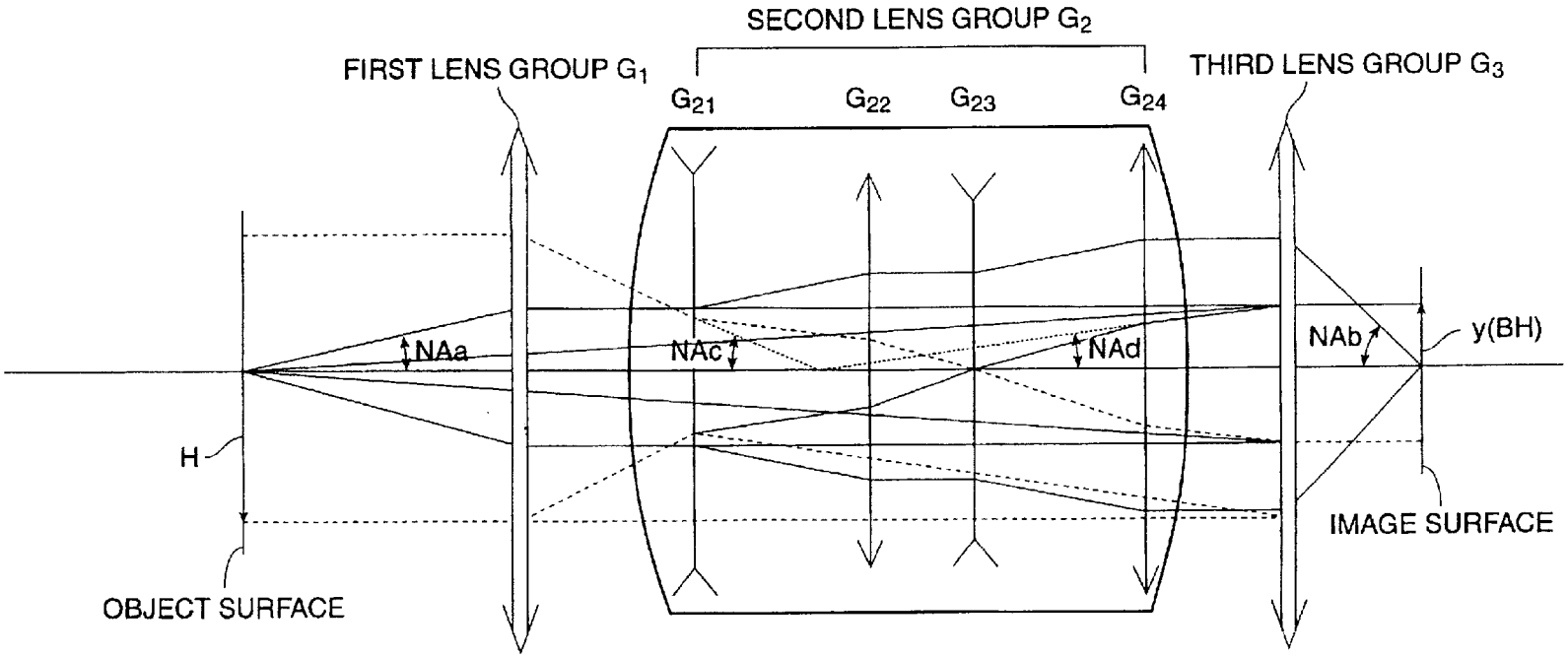
FIG. 3 is a drawing to show how the sufficient angle of view and NA are achieved by the configuration as in FIG. 2.

For that purpose, as shown in FIG. 3, it is preferable to maintain the ratio between a numerical aperture $NA_a$ on the object side (reticle side) in the first group of lenses G1 and the sine of the angle of incidence between the principal ray emerging from the second group of lenses G2 and the optical axis (hereinafter called "numerical aperture $NA_d$ related to the pupil on the emergence side of the second group of lenses"), and the ratio between a numerical aperture $NA_b$ on the image side (wafer side) in the third group of lenses G3 and the sine of the angle of incidence between the principal ray incident on the second group of lenses G2 and the optical axis (hereinafter called "numerical aperture $NA_c$ related to the pupil on the incidence side of the second group of lenses") nearly equal.

This implies equalizing the load is correcting aberration of the projection optical system that is related to the numerical aperture $NA_a$ on the object side in the first group of lenses G1 and the numerical aperture $NA_c$ related to the pupil on the incidence side of the second group of lenses, and the load in correcting aberration of the projection optical system that is related to the numerical aperture $NA_b$ on the image side (wafer side) in the third group of lenses G3 and the numerical aperture $NA_d$ related to the pupil on the emergence side of the second group of lenses G2.

Enciphering the above mentioned yields the following Eq. (14) or (15).

$$NA_a:NA_d=NA_b:NA_c \tag{14}$$

$$NA_a\times NA_c=NA_b\times NA_d \tag{15}$$

Therefore, if the projection magnification of the projection optical system is represented by B, the focal length of the first group of lenses G1 is represented by $f_1$, the focal length of the third group of lenses G3 is represented by $f_3$, a maximum object height (e.g., a half the length of the diagonal line in the available pattern region on the reticle) from the optical axis of the projection optical system is represented by H, then the above mentioned Eq. (15) can be modified into the following Eq. (16).

$$(NA_b\cdot B)\times(H/f_1)=NA_b\times(H\cdot B/f_3) \tag{16}$$

Furthermore, modifying the above mentioned Eq. (16) eventually derives the following Eq. (17).

$$f_1=f_3 \tag{17}$$

From the above mentioned Eq. (17), by nearly equalizing the focal length $f_1$ of the first group of lenses G1 and the focal length $f_3$ of the third group of lenses G3, it can be understood that it is possible to correct, in a well balanced manner, the aberration related to the angle of view (image field curvature, astigmatic aberration, coma aberration, distortion) and the aberration (spherical aberration) related to the numerical aperture on the image side of the projection optical system, and attain the projection optical system with high resolution and a high numerical aperture on the image side, while maintaining a large exposure area.

Thus, in order to maintain the balance of various aberrations and the wide exposure area, it is ideal to satisfy the above mentioned Eq. (17), however, in reality, it is sufficient to satisfy the range of the above mentioned Condition (V).

At below the lower limit of Condition (V), however, if the focal length $f_1$ of the first group of lenses G1 is fixed, then the focal length $f_3$ of the third group of lenses G3 becomes shorter, and the numerical aperture $NA_d$ related to the pupil on the emergence side of the second group of lenses becomes large. As a result, it will become difficult to successfully correct the aberration (image field curvature, astigmatic aberration, coma aberration and the distorted aberration) related to the angle of view, while correcting the aberration (spherical aberration) related to the numerical aperture on the image side of the projection optical system and increasing the numerical aperture $NA_b$ on the image side (wafer side), and then it will become impossible to obtain excellent image formation performance.

Also, if the focal length $f_3$ of the third group of lenses G3 is fixed, then the focal length $f_1$ of the first group of lenses G1 will become longer, and although it will be relatively easier to correct the aberration (spherical aberration) related to the numerical aperture on the image side of the projection optical system and the aberration related to the angle of view (image field curvature, astigmatic aberration, coma aberration and distortion aberration), the distance from the object plane (reticle plane) to the first lens surface of the projection optical system $d_o$ will become longer. Because of this, not only the overall length of the projection optical system but also the diameter of the lens will become longer, and it will become extremely difficult to attempt to keep the projection optical system compact. At above the upper limit of Condition (V), if the focal length $f_1$ of the first group of lenses G1 is fixed, the focal length $f_3$ of the third group of lenses G3 becomes longer, then it will become relatively easier to correct the aberration (spherical aberration) related to the numerical aperture on the image side of the projection optical system and the aberration due to the angle of view (the image filed curvature, astigmatic aberration, coma aberration and the distorted aberration), but the distance from the last lens surface of the projection optical system to the image field (wafer plane) will become longer. Because of this, the overall length of the projection optical length as well as the diameter of the lenses will become longer, and it will become impossible to attempt to make the projection optical system compact. Furthermore, if the focal length $f_3$ of the third group of lenses G3 is fixed, then the focal length $f_1$ of the first group of lenses G1 will become shorter, and the numerical aperture $NA_c$ related to the pupil on the incidence side of the second group of lenses will become larger, and it will become difficult to better the aberration related to the angle of view (image field curvature, astigmatic aberration, coma aberration and distorted aberration), and as a result, the favorable image formation performance cannot be obtained. Furthermore, in order to obtain more preferable image formation performance, while keeping the projection optical system more compact, it is more preferable to define as $f_3/f_1\leqq 1.2$ with the upper limit of Condition (V) being 1.2. This enables the length of the focal length $f_3$ of the third group of lenses G3 to be constrained, and prevents an increase in the effective aperture in the third group of lenses G3 even though the numerical aperture $NA_b$ becomes large.

Also, in order to make a system further compact sufficiently, it is preferable to further satisfy the following Condition (VI) in addition to the above mentioned Conditions.

$$0.05\leqq f_1/L\leqq 0.3 \tag{VI}$$

This is provided that $f_1$ represents the focal length of the first group of lenses G1 and L represents the distance (the distance between the object and the image) between the first object (reticle) and the second object (wafer).

Condition (VI) is to warrant shortening the overall length of the projection optical system by providing for the optimal ratio of the focal length $f_1$ of the first group of lenses G1 and the distance between the object and the image L.

At above the upper limit of Condition (VI), it will become difficult to keep the projection optical system compact because the overall length of the projection optical system becomes longer. On the contrary, at below the lower limit of Condition (VI), it will become difficult to correct various aberrations because the power (refractive power) of the first group of lenses G1 becomes too strong with respect to the distance between the object and the image L. Furthermore, in order to correct aberration in the entire projection optical system satisfactorily, it is more preferable to define Condition (VI) as $0.15 \leqq f1/L$ with the lower limit of 0.15.

Also, in order to shorten the overall length of the projection optical system sufficiently, it is desirable to satisfy the following Condition (VII)

$$0.03 \leqq H/L \leqq 0.2 \quad \text{(VII)},$$

wherein H expresses the maximum object height (a half the length of the diagonal line within the available pattern region on the reticle) from the optical axis of the projection optical system on the first object (reticle), and L expresses the distance (the distance between the object and the image) between the first object (reticle) and the second object (wafer).

Condition (VII) is to provide for the optimal ratio of the distance L between the object and the image with respect to the maximum object height H. If the distance L between the object and the image against the maximum object height H becomes longer at below the lower limit of Condition (VII), it will become impossible to attempt to keep the system compact because the overall length of the projection optical system becomes too long. On the contrary, surpassing the upper limit of Condition (VII) makes it difficult to correct various aberrations well over the entire image formation field (the entire wafer surface). Furthermore, in order to better the aberration over the entire imaging surface, while maintaining the image surface flat, it is more preferable to define Condition (VII) as $H/L \leqq 0.1$ with the upper limit of 0.1.

Also, in order to correct the various aberrations in a well-balanced manner, while maintaining the degree of freedom in correcting various aberrations, in the case when it is all composed by spherical optical elements, it is desirable if the first group of lenses G1 comprises at least 2 or more positive lenses, the second group of lenses G2 comprises at least 4 or more negative lenses and at least 4 or more positive lenses, and the third group of lenses G3 comprises at least 2 or more positive lenses. Furthermore, if one or more aspherical optical elements are used instead of spherical optical elements for each lens group, it is possible to reduce the number of optical elements to constitute the entire optical system and secure higher transmittance of rays, making the system lighter, and if the same number of the elements are used, then, it is possible to have an optical system of higher performance (higher NA and larger visual field).

So far, the projection optical system based on the lens groups comprising, viewed from the object side (reticle side), in order of succession, the first group of lenses G1 with positive refractive power, the second group of lenses G2 that substantially consists of afocal systems, and the third group of lenses G3 with positive refractive power, has been described. Explained next is the structure of the second group of lenses G2 for the purpose of keeping the overall size of the projection optical system compact and successfully correcting image field curvature. It is desirable if the second group of lenses G2, which substantially consists of afocal systems, comprises, as shown in FIG. 2 and FIG. 3, viewed from the object side (reticle side), in order of succession, at least a first group of sub lenses G21 with negative refractive power, a second group of sub lenses G22 with positive refractive power and a third group of sub lenses G23 with negative refractive power.

First of all, the negative first group of sub lenses G21 in this second group of lenses G2 and the positive second group of sub lenses G22 place a principal point on the image side (wafer side) and shorten the distance from the object plane (reticle plane) to the projection optical system, and thus shorten the overall length of the projection optical system in order to form the reverse-Galileo system (or retro-focus system). Also, the third group of sub lenses G23 in the second group of lenses G2 contributes mainly to the correction of the Petzval sum and smoothes the image field by satisfactorily, correcting the image field curvature.

Furthermore, although there is a danger that the entrance pupil of the projection optical system comes closer to the object plane (reticle plane) because the above mentioned first group of sub lenses G21 and the second group of sub lenses G22 form the reverse-Galileo system, it is desirable to approximately match the secondary focal point (the image side or the wafer side) of the positive first group of lenses G1 with the entrance pupil position of the optical system G2 and thereafter, and this will make it possible to place the entrance pupil position of the projection optical system farther from the object plane (reticle plane), while keeping the overall length of the projection optical system short.

In order to have the second group of lenses G2 function to correct aberration satisfactorily, while keeping the system compact enough, based on the basic configuration of the above mentioned second group of lenses G2, it is desirable to further satisfy the following conditional Eqs. (VIII) and (IX)

$$1.5 \leqq |f_{22}/f_{21}| \leqq 5 \quad \text{(VIII)}$$

$$0.02 \leqq |f_{23}/L| \leqq 0.10 \quad \text{(IX)},$$

wherein the focal length of the first group of sub lenses G21 is represented by $f_{21}$, the focal length of the second group of sub lenses G22 is represented by $f_{22}$, and the focal length of the third group of the sub lenses G3 is represented by $f_{23}$.

Condition (VIII) corresponds to giving the optimal magnification for the first group of sub lenses G21 and the second group of sub lenses G22 that comprises the reverse Galileo system (or retro focus system), and it is a condition to keep the overall length of the projection optical system compact. Going below the lower limit of Condition (VIII) makes it difficult to keep the projection optical system compact. Furthermore, in order to satisfactorily keep the system compact, supposing the lower limit value of Condition (VIII) is 1.7, it is more desirable if $1.7 \leqq |f_{22}/f_{21}|$. On the contrary, surpassing the upper limit of Condition (VIII) causes the focal length $f_{21}$ of the first group of sub lenses G21 to become short, and it will become extremely difficult to correct various aberrations, and even if the focal length $f_{21}$ of the first group of sub lenses G21 is fixed, the focal length $f_{22}$ of the second group of sub lenses G22 will become longer, and the system will not be compact enough. Furthermore, in order to make it more advantageous in correcting various aberrations by giving an appropriate focal length of the first group of sub lenses G21, it is more desirable to define Condition (VIII) as $|f_{22}/f_{21}| \leqq 3.5$ with the upper limit of 3.5.

Also, Condition (IX) is a condition to have the third group of lenses G23 function to correct the Petzval sum satisfactorily. Going below the lower limit of Condition (IX) causes the focal length $f_{23}$ of the third group of sub lenses G23 to become too short, and it will become difficult to correct various aberrations, and on the contrary, surpassing the upper limit of Condition (IX) causes the Petzval sum to be corrected insufficiently, and it will become difficult to smooth the image field. Furthermore, in order to correct the Petzval sum satisfactorily, it is more desirable to define Condition (IX) as $|f_{23}/L''| \leqq 0.08$ with the upper limit of 0.08.

Also, in order to place the entrance pupil of the projection optical system farther from the object, it is desirable to satisfy the following Condition (X)

$$4 \leqq |fa/f_{23}| \quad \text{(X)},$$

wherein the composite focal length of the first group of lenses G1 with positive refractive power, the first group of sub lenses with negative refractive power G21 in the second group of lenses G2 as well as the second group of sub lenses with positive refractive power G22 in the second group of lenses G2 is represented by $f_a$, the focal length of the third group of sub lenses G23 in the second group of lenses G2 is represented by $f_{23}$.

In order to place the entrance pupil of the projection optical system farther, it is preferable to satisfy Condition (I) as mentioned before, but in order to fully assure this, within this Condition (I), it will become necessary to make the focal length of the entire system F longer in proportion to the projection magnification B and the distance between the object and the image L, supposing the distance between the first object and the second object L and the projection magnification B are fixed.

Therefore, Condition (X) shows a condition to make the focal length of the entire system F larger, in proportion to the projection magnification B and the distance between the first object and the second object L, because simply making a focal length of each group longer to make the ratio of the focal length of the projection optical system F longer would also make the distance between the object and the image L longer. In other words, if the composite focal length of the first group of lenses G1, the first group of sub lenses G21 in the second group of lenses G2 and the second group of sub lenses G22 $f_a$ is made 4 times or more longer than the focal length $f_{23}$ of the third group of sub lenses, the distance between the first object and the second object L will be controlled, and the focal length of the overall system F will be maintained large in proportion to the projection magnification B. Also, satisfying the range of this Condition (X) implies that the focal length $f_{23}$ of the third group of sub lenses G23 with negative refractive power can be maintained smaller than the composite focal length $f_a$ that is on the first object side than the third group of sub lenses G23, making the Petzval sum smaller as well as maintaining the image field flat.

At below the lower limit of Condition (X), not only will it become difficult to make the focal length of the entire system F larger compared to the projection magnification B and the distance between and the first object and the second object L, it will become difficult to maintain the image field flat. Furthermore, in order to shorten the length of the overall system as well as making the focal length of the overall system longer, it is more preferable to define Condition (X) as $4.4 \leqq |fa/f_{23}|$ with the lower limit of 4.4. Furthermore, in order to be more advantageous in correcting various aberrations by giving a pertinent focal length to the third group of sub lenses G23, it is more desirable to set the upper limit value and define Condition (X) as "$fa/f_{23}|<8$.

Furthermore, when the distance (the distance between the object and the image) between the first object (reticle) and the second object (wafer) is represented by L, the focal length of the first group of lenses G1 is represented by $f_1$, the focal length of the third group of lenses G3 is represented by $f_3$, and the focal length of the ith group of sub lenses from the object side in the second group of lenses G21 is represented by $f_{2i}$, it is desirable to satisfy $$-50 \leqq (L/f_1)+(L/f_3)+\Sigma(L/f_{2i}) \leqq 0.5 \quad \text{(XI)}.$$

This is provided that $\Sigma(L/f_{2i})$ indicates $(L/f_{21})+(L/f_{22})+(L/f_{23})$ . . . , and i is 1, 2, 3 . . . (natural number).

In Condition (XI), giving a longer focal length to groups of lenses with positive refractive power compared to the focal length of the groups of lenses with negative refractive power helps to make the focal length F of the entire projection optical system larger in order to secure deviation from telecentricity favorably. Concurrently, it is also possible to maintain the absolute values of the first group of sub lenses G21 and the third group of sub lenses G23 with negative refractive power in the second group of lenses G2 relatively large, and thus secure the flatness of the image surface by contributing to the correction of the Petzval sum.

At above the upper limit of Condition (XI), it will become either difficult to make the focal length of the projection optical system F or to correct the field curvature difficult. On the contrary, at below the lower limit of Condition (XI), the negative refractive power becomes too strong, and it will become difficult to make the focal length of the overall system F larger and to correct the field curvature. In order to make the ratio of the focal length F of the overall system to the overall length larger, while maintaining the image surface flat further satisfactorily, it is more desirable to define Condition (XI) as $(L/f_1)+(L/f_3)+\Sigma(L/f_{2i}) \leqq -10$ with the upper limit of −10.

Furthermore, it was previously described to the effect that, in order to correct various aberrations and secure a degree of freedom in correcting the various aberrations, it is preferable to have such a configuration wherein the second group of lenses G1 has, when all the components are spherical optical elements, at least 4 or more negative lenses and at least 4 or more positive lenses, and a more preferable configuration of the second group of lenses G2 comprises the first group of sub lenses G21 with at least 2 or more negative lenses and the second group of sub lenses G22 with at least 4 or more positive lenses, and the third group of sub lenses G23 with at least 2 or more negative lenses.

What is furthermore preferable would be that at least 2 positive lenses out of 4 or more positive lenses in the second group of sub lenses G22 are biconvex lenses.

Also, if one or more aspherical optical elements are used for each group of sub lenses that constitutes the second group of lenses G2, instead of spherical optical elements, it will become possible to reduce the number of optical elements to constitute the entire optical system and secure a higher ray transmittance, making the system lighter, and if the same number of the components are used, then it will become possible to have an optical system of higher performance (higher NA and a larger visual field).

Incidentally, although the second group of lenses G2 according to the present invention composes a substantially afocal system, it does not necessarily have to be the perfect afocal system.

Hence to be concrete, when the paraxial marginal ray is traced, with the position where the object height h on the object (reticle) is zero (the position where the reticle and the optical axis of the projection optical system intersect) as the axial object point, if the space between lenses where the variation of the inclination of the paraxial marginal ray shows its tendency to become 0 in the region closest to the object (reticle side), and the inclination becomes 0 or closest to 0 is designated as the boundary between the first group of lenses G1 and the second group of lenses G2, and if the space between lenses where the variation of the inclination of the paraxial marginal ray shows its tendency to become 0 in the region closest to the image (wafer side), and the inclination becomes 0 or closest to 0 is designated as the boundary between the second group of lenses G2 and the third group of lenses G3, then the second group of lenses G2 in that case will be included in the definition of the afocal system connoted by the present invention.

Figure 4:
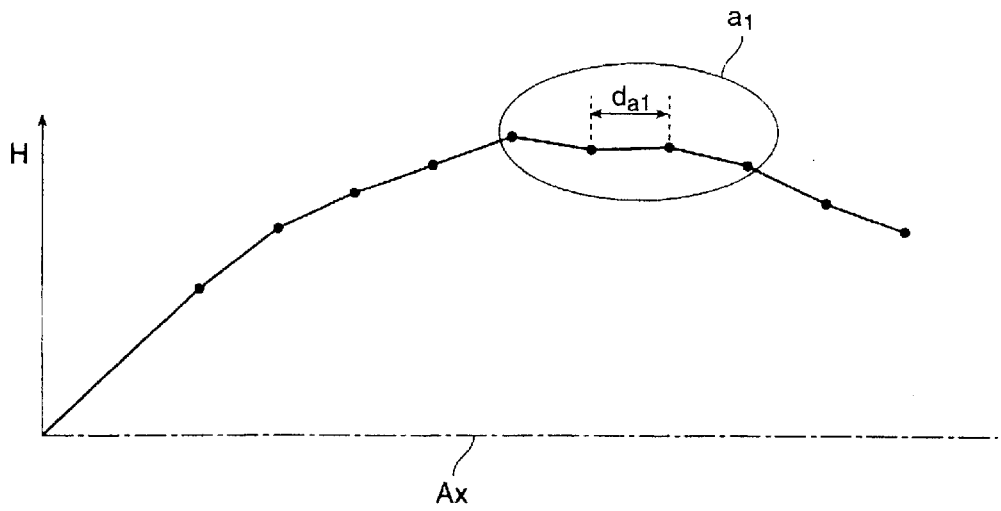
FIG. 4 is one example of ray behavior in the vicinity ($a_1$) between the lens groups G1 and G2, showing the slope of the height of the paraxial marginal ray from the axial object point being incident on lens surfaces indicating its tendency to peak in the vicinity closest to the object, and moreover, the inclination is near 0.
Figure 5:
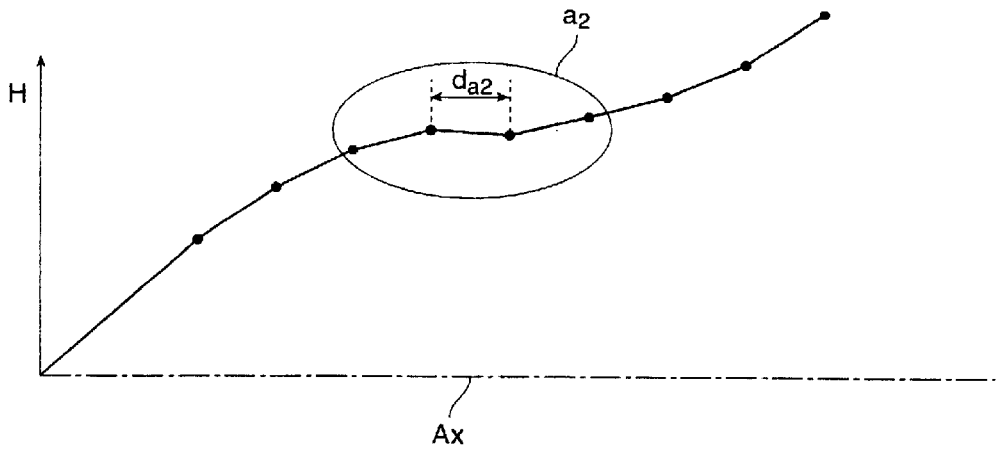
FIG. 5 is an other example of ray behavior in the vicinity ($a_2$) between the lens groups G1 and G2, wherein the variation of the inclination of the paraxial marginal ray from the axial object point indicates its tendency to be 0 in the vicinity closest to the object, and the inclination is near 0, and then the height of the ray incident on lenses indicates its tendency to increase.

Therefore, in order to facilitate the understanding of the substantially afocal second group of the lenses G2 set forth in the present invention, the way the lenses are divided into the first group of lens G1~ the third group of lenses G3 will be explained in reference to FIGS. 4~7. FIGS. 4 and 5 qualitatively show the optical path of the paraxial marginal ray in the region ($a_1$, $a_2$) closest to the object side (reticle side) where the variation of the inclination of the paraxial marginal ray shows its tendency to become 0 when the paraxial marginal ray is traced, and FIGS. 6 and 7 qualitatively show the optical path of the paraxial marginal ray in the region ($b_1$, $b_2$) closest to the image side (wafer side) where the variation of the inclination of the paraxial marginal ray shows its tendency to become 0. This is provided that the points plotted in the optical path of the paraxial marginal ray in FIGS. 4~7 connote the height of the position at each of the surfaces of the lenses in the projection optical system where the paraxial marginal ray from the optical axis Ax passes through.

First of all, FIG. 4 shows the slope of the paraxial marginal ray in the region $a_1$ that includes the position where the height of the paraxial marginal ray that is incident on each lens of the projection optical system shows its tendency to peak in the vicinity closest to the object and the vicinity thereof. In this case, the boundary between the first group of lenses G1 and the second group of lenses G2 will be at a position in the lens space $d_{a1}$ where the inclination of the paraxial marginal ray is either zero or closest to zero in the region $a_1$.

FIG. 5 shows the slope of the paraxial marginal ray when the inclination is in its tendency to increase. And in the region $a_2$, the variation of the inclination of the paraxial marginal ray that is incident on each lens of the projection optical system tends to be close to 0 in the vicinity closest to the object side (reticle side) in the projection optical system, and the inclination becomes near 0. In this case, the boundary between the first group of lenses G1 and the second group of lenses G2 will be at a position in the space between lenses $d_{a2}$ where the angle of the slope of the paraxial marginal ray is either zero or closest to zero in the region $a_2$.

Figure 6:
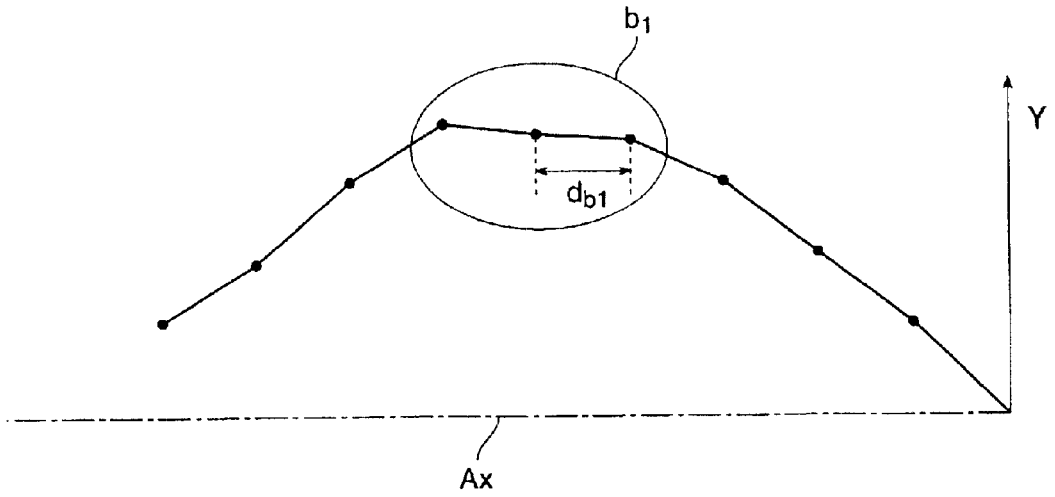
FIG. 6 shows one example of ray behavior in the region ($b_1$) between the lens groups G2 and G3, wherein the height of the paraxial marginal ray from the axial object point that is incident on lens surfaces indicates its tendency to peak in the vicinity closest to the image side, and moreover, the inclination is near 0.

FIG. 6 shows the slope of the ray in the region $b_1$ that includes the position where the height of the paraxial marginal ray that is incident on each lens of the projection optical system shows its tendency to peak in the vicinity closest to the object or the vicinity thereof. In this case, the boundary between the second group of lenses G2 and the third group of lenses G3 will be at a position $d_{b1}$ between the lenses where the angle of the slope of the paraxial marginal ray becomes either zero or closest to zero in the region $b_1$.

Figure 7:
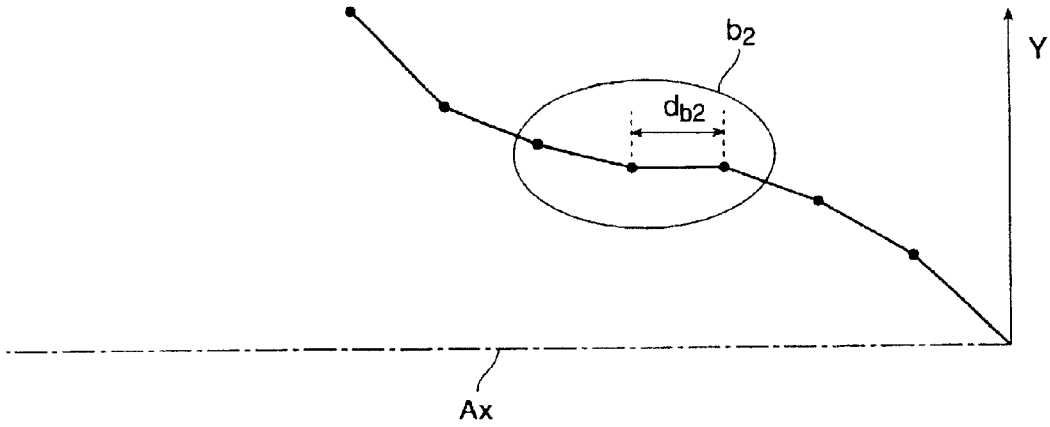
FIG. 7 shows an other example of ray behavior in the region ($b_2$) between the lens groups G2 and G3, wherein the height of the paraxial marginal ray from the axial object point that is incident on lens surfaces indicates its tendency to decrease, and then the variation of the inclination indicates its tendency to become 0 in the vicinity closest to the object, and the inclination becomes near 0.

FIG. 7 shows the slope of the paraxial marginal ray when the inclination of the paraxial marginal ray is in its tendency to decrease. And in the region $b_2$, the variation of the inclination of the paraxial marginal ray that is incident on each lens of the projection optical system tends to be close to 0 in the vicinity closest to the image side (wafer side), and the inclination becomes near 0. In this case, the boundary between the second group of lenses G2 and the third group of lenses G3 will be at a position in the space between the lenses $d_{b2}$ where the angle of the slope of the paraxial marginal ray becomes either zero or closest to zero in the region $b_2$.

In order to have the second group of lenses G2 function as an afocal system sufficiently based on the above mentioned lens configurations of the first group of lenses G1~the third group of lenses G3, if the angle of incidence of the paraxial marginal ray as the paraxial marginal ray from the axial object point on the object (reticle) is incident on the first group of lenses G1 is represented by $u_1$, the angle of incidence of the paraxial marginal ray when the paraxial marginal ray from the axial object point on the object (reticle) is incident on the second group of lenses G2 is represented by $u_2$, the angle of emergence of the paraxial marginal ray when the paraxial marginal ray from the axial object point on the object (reticle) emerges from the second group of lenses G2 is represented by $u_2'$, the angle of emergence of the paraxial ray when the paraxial marginal ray from the axial object point on the object (reticle) emerges from the third group of lens G3 is represented by $u_3'$, then it is desirable to satisfy the following equations.

$$|u_2/u_1| \leqq 0.5 \quad \text{(XII)}$$

$$|u_2'/u_3'| \leqq 0.5 \quad \text{(XIII)}$$

Unless Conditions (XII) and (XIII) are satisfied, it will become difficult to correct the aberrations related to the angle of view (image field curvature, astigmatic aberration, coma aberration and distortion) and the aberrations related to the numerical aperture NA on the image side of the projection optical system (spherical aberration) well-proportionately, and it will be impossible to realize the kind of the projection optical system as set forth in the present invention as its object. Furthermore, in order to make the aberration related to the angle of view and the aberration regarding the numerical aperture NA on the image side of the projection optical system well-balanced, it is more preferable to define Conditions (XII) and (XIII) as $|u_2/u_1| \leqq 0.3$, and $|u_2'/u_3'| \leqq 0.3$ respectively with each of the upper limit of 0.3.

Furthermore, in order to have the substantially afocal second group of lenses G2 function further sufficiently, it is furthermore desirable to satisfy $$|f_2|/f_1 > 1 \quad \text{(XIV)}$$

$$|f_2|/f_3 22\ 1 \quad \text{(XV)},$$

wherein the focal length of the first group of the lenses G1 is represented by $f_1$, the focal length of the second group of lenses G2 is represented by $f_2$, and the focal length of the third group of lenses G3 is represented by $f_3$.

Unless Condition (XIV) is satisfied, it will be impossible to make the deviation from telecentricity on the object side (reticle side) small with the first group of the lenses G1, and the kind of the projection optical system as set forth in the present invention as its object is unattainable. Furthermore, in order to secure sufficiently small deviation from telecentricity, it is more preferable to define Condition (XIV) as $|f_2|/f_1 \geqq 1.5$ with the lower limit of 1.5 or more.

Also, in the case when the focal length of the second group of lenses G2 is negative, deviating from the relation of Condition (XV), the paraxial marginal ray which emerges from the second group of lenses G2 will diverge. Owing to this, the numerical aperture NA on the image side (wafer side) of the projection optical system becomes smaller, rendering it difficult to realize the projection optical system with high resolution. And an attempt to secure the numerical aperture NA on the image side (wafer side) of the projection optical system will increase the lens diameter of the third group of the lenses G3, rendering it difficult to keep the system compact. Also, when the focal length of the second group of lenses becomes positive, deviating from the relationship of Condition (XV), although it is possible to secure the numerical aperture NA on the image side (wafer side) of the projection optical system, it will become impossible to secure the distance (back focus) between the projection optical system and the image field (wafer plane), rendering it undesirable. Because of this, an attempt to secure the distance (back focus) between the projection optical system and the image field (wafer surface) brings an increase in the lens diameter of the second group of the lenses G2, and thus the system cannot be kept compact. Furthermore, in order to achieve high imaging performance, it is more preferable to define Condition (XV) as $|f_2|/f_3 \leqq 1.5$ with the lower limit of 1.5, or more.

Also, as described before, it is preferable that the second group of the lenses G2 comprises, view from the object side (reticle side), in order of succession, at least the first group of sub lenses with negative refractive power G21, the second group of sub lenses G22 with positive refraction power, and the third group of sub lenses with negative refractive power G23, but as shown in FIG. 2 and 3, it is also acceptable to place the fourth group of sub lenses G24 with positive refraction power on the image side of the third group of sub lenses G23 with negative refractive power. This enables the sharing of the load with the fourth group of sub lenses G24 in the third group of lenses G3 which is greatly related to the correction of spherical aberration for the purpose of increasing the numerical aperture NA on the image side (wafer side) of the projection optical system, and thus a well-balanced correction of the spherical aberration can be attained. At that time, the first group of sub lenses G21 and the second group of sub lenses G22 compose the reverse-Galileo system or retro-focus system, and the third group of sub lenses G23 and the fourth group of sub lenses G24 also compose the reverse-Galileo system or retro focus system. Therefore, since the second group of lenses G2 comes to have two partial optical systems (reverse Galileo system or retro focus system) which contribute to keeping the projection optical system compact, the addition of the fourth group of lenses G24 does not virtually cause the size of the projection optical system to be enlarged.

And, even in the case where the second group of lenses G2 has four groups of sub lenses, it is needless to say that the above mentioned Conditions (I)~(XV) can be applied, and furthermore, when the fourth group of sub lenses G24 is placed in the second group of lenses, it is preferable if G24 comprises at least two or more positive lenses in order to accomplish a satisfactory correction of spherical aberration.

Also, in the case where the second group of lenses G2 comprises only three groups of lenses which are, viewed from the object side (reticle side), in order of succession, the first group of sub lenses G21 with negative refractive power, the second group of sub lenses G22 with positive refractive power and the third group of sub lenses G23 with negative refractive power, it is possible to make the ray emerging from the third group of sub lenses G23 an almost parallel ray bundle by making the ray emerging from the second group of sub lenses G22 convergent ray bundle. In this case, the application of the above mentioned Conditions (I)~(XV) is also possible. Accordingly, the lens arrangement of the fourth group of sub lenses G24 is not essential in concretely composing the second group of lenses.

In the following, embodiments according to the present invention will be described in detail. The projection optical system in this embodiment is what is applied to the projection aligner shown in FIG. 8.

Figure 8:
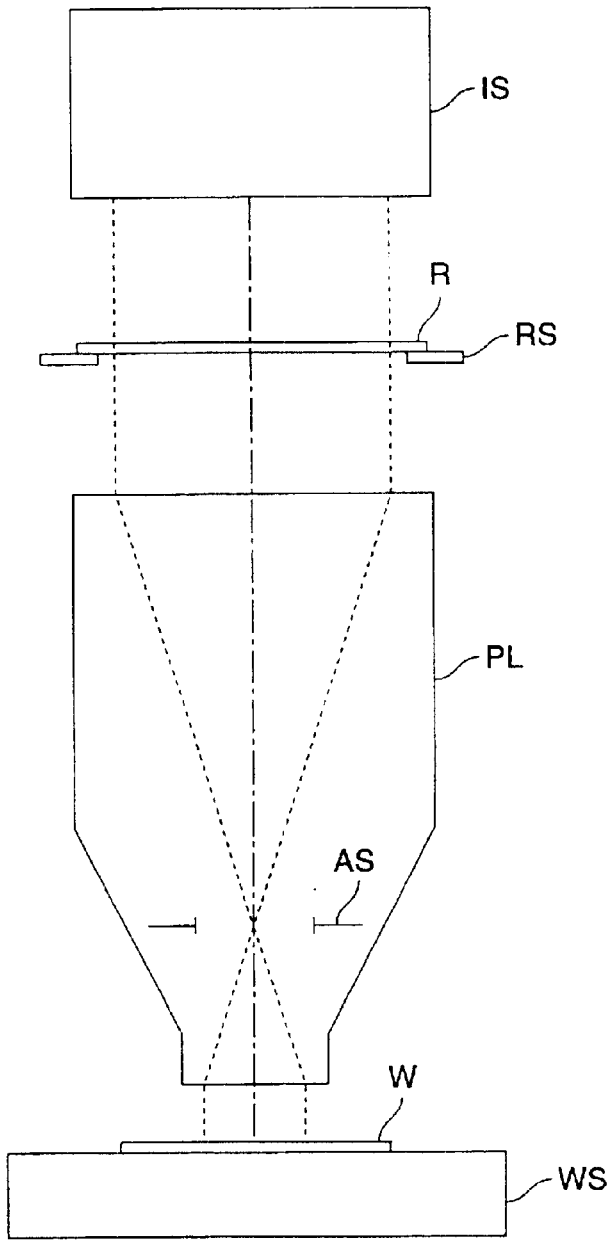
FIG. 8 shows a schematic structure of the projection aligner when the projection optical system according to the present invention is applied thereto.

First of all, explaining FIG. 8 briefly, as shown in the figure, a reticle R as an original edition for projection on which the fixed integrated circuit pattern is formed, is placed on the object plane of the projection optical system PL, and a wafer W as a substrate is placed on the image field of the projection optical system PL. The reticle R is held by a reticle stage RS, and the wafer W is held by a wafer stage WS. Also, an illumination optical apparatus IS is installed above the reticle R in order to illuminate the reticle R evenly.

The light supplied from the illumination optical system IS according to the above mentioned configuration illuminates the reticle R, and the image formed by the light source in the illumination optical system IS at the pupil position (aperture stop AS position) of the projection optical system PL. Thus so-called Koehler illumination is provided. And the pattern on the reticle R which is Koehler illuminated by the projection optical system PL will be exposed (printed) onto the wafer W by the projection optical system PL.

The present invention shows an example wherein the projection optical system uses excimer laser which supplies the ray with 248 nm exposure wavelength $\lambda$ as a light source, which is installed inside the illumination optical system IS, and FIGS. 9~14 show the arrangement of the lenses of the projection optical system of the 1st~6th embodiments.

As shown in FIGS. 9~14, the projection optical system in each of the embodiments has, viewed from the object side (reticle side), in order of succession, the first group of lenses with positive refractive power G1, the second group of lenses G2 consists of afocal systems, and the third group of lenses G3 with positive refractive power, and the second group of lenses G2 has, viewed from the object side (reticle side), in order of succession, the first group of sub lenses with negative refractive power G21, the second group of sub lenses G22 with positive refractive power, the third group of sub lenses G23 with negative refractive power, and the fourth group of sub lenses G24 with positive refractive power, and it is an optical system whose deviation from telecentricity is extremely small on the object side (reticle side) as well as on the image side (wafer side).

Figure 9:
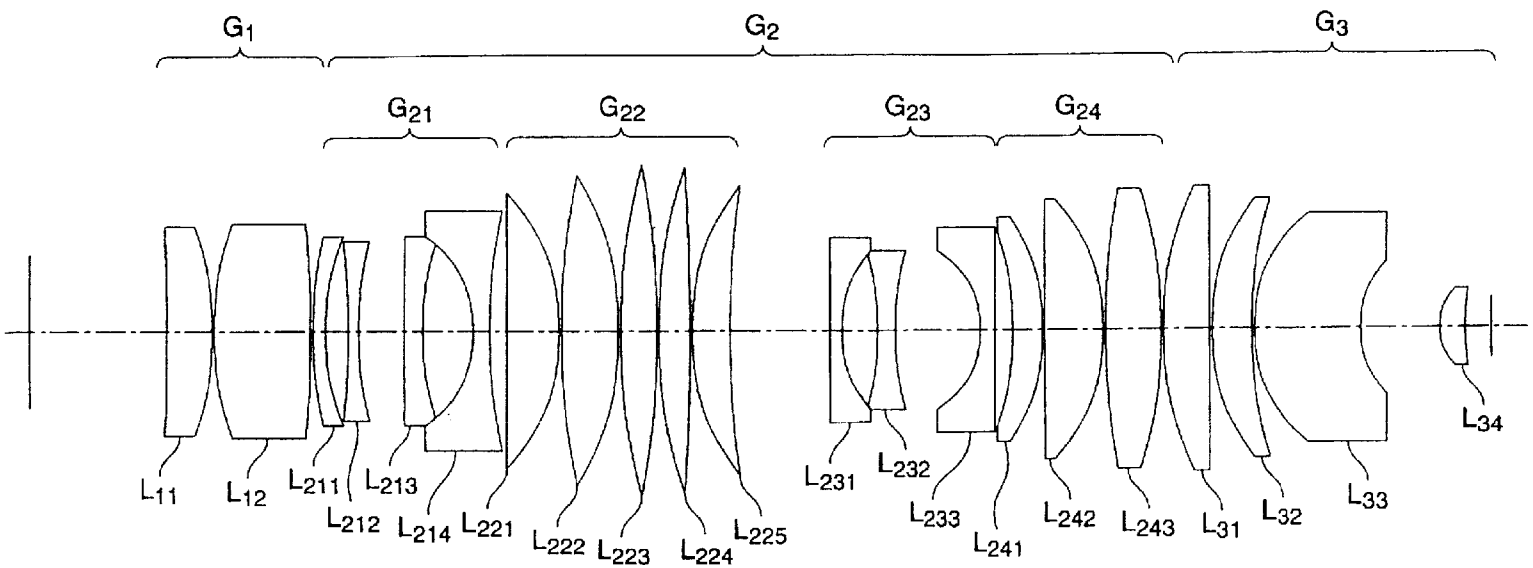
FIG. 9 shows the lens arrangement of the first embodiment according to the present invention.

The projection optical system as in the first embodiment shown in FIG. 9 has a spec. which stipulates that the distance between the object and image L (the distance from the object plane to image field, or the distance from the reticle R to the wafer W) is 1000, the numerical aperture NA on the image side is 0.56, the projection magnification B is ¼, and the diameter of the exposure area over the wafer W is 23.4.

To explain the concrete lens arrangement of the first embodiment, as shown in FIG. 9, the first group of lenses G1 with positive refractive power comprises, view from the object side, in order of succession, a positive meniscus lens with its convex facing the image side $L_{11}$ and a bioconvex positive lens $L_{12}$, and the first group of sub lenses G21 in the second group of lenses G2 comprises, viewed from the object side, in order of succession, a negative meniscus lens with its stronger curvature facing the image side $L_{211}$, the negative bioconcave lens $L_{212}$, a negative lens with its stronger curvature facing the image side $L_{213}$, and a negative lens with its stronger curvature facing the object side $L_{214}$.

And the second group of sub lenses G22 in the second group of lenses G2 comprises, view from the object side, in order of succession, a positive lens with its stronger curvature facing the image side $L_{221}$, three positive bioconcave lenses ($L_{222}$~$L_{224}$), and a positive meniscus lens with its convex facing the object side, $L_{225}$, and the third group of sub lenses G23 in the second group of lenses G2 comprises, viewed from the object side, in order of succession, a negative lens with its stronger curvature facing the image side $L_{231}$, a negative bioconcave lens $L_{232}$, and a negative lens with its stronger curvature facing the object side $L_{233}$. The fourth group of sub lenses G24 in the second group of the lenses G2 comprises, view from the object side, in order of succession, two positive lenses with their convex facing the image side ($L_{241}$, $L_{242}$) and a positive bioconcave lens $L_{243}$, and the third group of lenses G3 comprises, view from the object side, in order of succession, two positive lenses with their convex facing the object side ($L_{31}$, $L_{32}$), a negative meniscus with its convex facing the object side $L_{33}$, and a positive lens with its concave facing the object side $L_{34}$.

Figure 10:
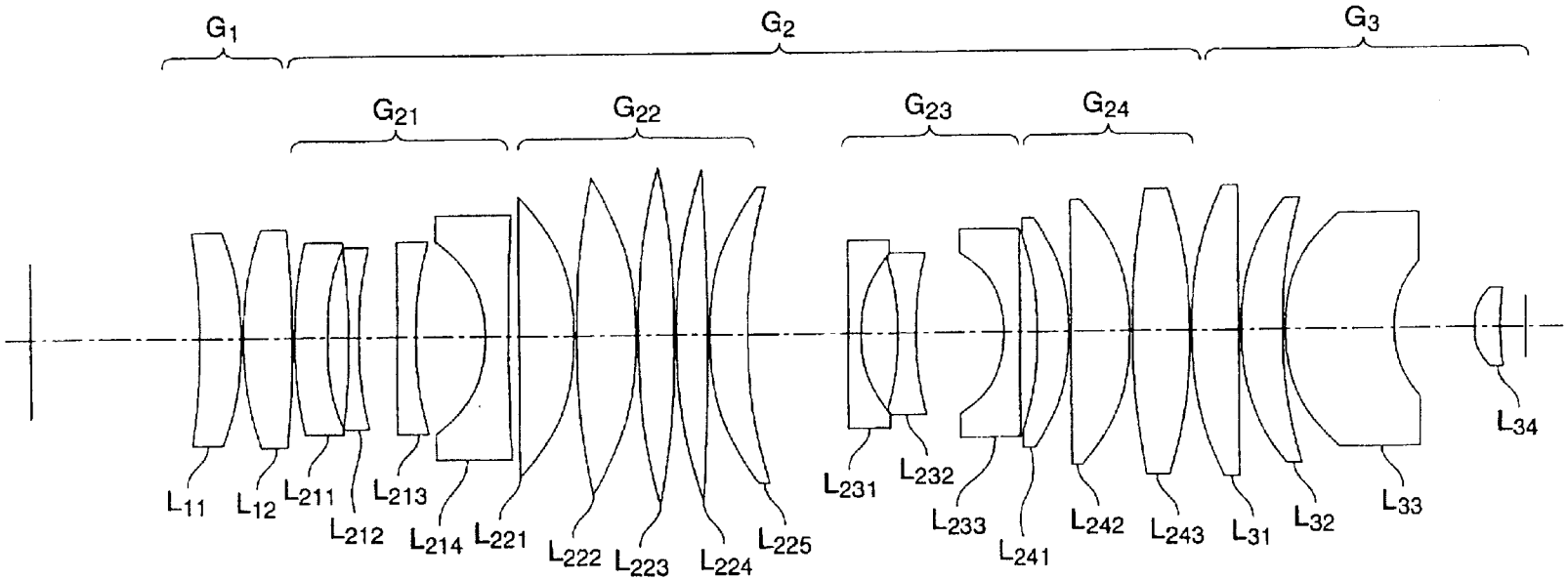
FIG. 10 shows the lens arrangement of the second embodiment according to the present invention.

The projection optical system in the second embodiment, shown in FIG. 10, has a specification that stipulates that the distance between the object and the image L is 1000, the numerical aperture NA on the image side is 0.56, the projection magnification B is ¼, and the diameter of the exposure area on the wafer W is 23.7.

A concrete lens arrangement of the second embodiment is, as shown in FIG. 10, basically similar to that of the first embodiment shown previously in FIG. 9, but the different point is that the second bioconvex positive lens $L_{12}$ in the first group of lenses G1 comprises thinner lenses than the ones in the first embodiment, and the meniscus negative lenses $L_{211}$ with its stronger curvature facing the image side which is the first lens in the first group of sub lenses G21 in the second group of lenses G2 comprises thicker lenses than that in the first embodiment.

Figure 11:
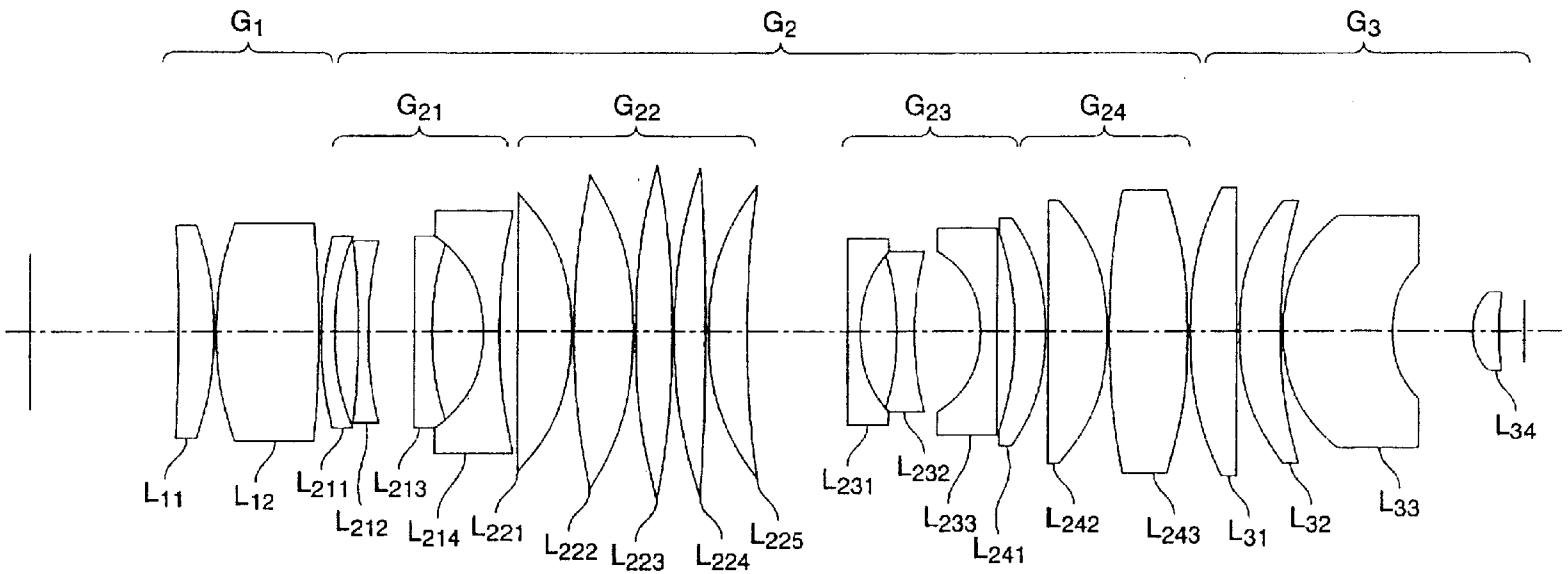
FIG. 11 shows the lens arrangement of the third embodiment according to the present invention.

The projection optical system in the third embodiment shown in FIG. 11 has a specification that stipulates that the distance between the object and the image L is 1000, the numerical aperture NA on the image side is 0.60, the projection magnification B is ¼, and the diameter of the exposure area on the wafer W is 20.0.

A concrete lens arrangement of the third embodiment is, as shown in FIG. 11, similar to the aforementioned first embodiment, but the different point is that the third bioconvex positive lens $L_{243}$ comprises thicker lenses than that in the first embodiment.

Figure 12:
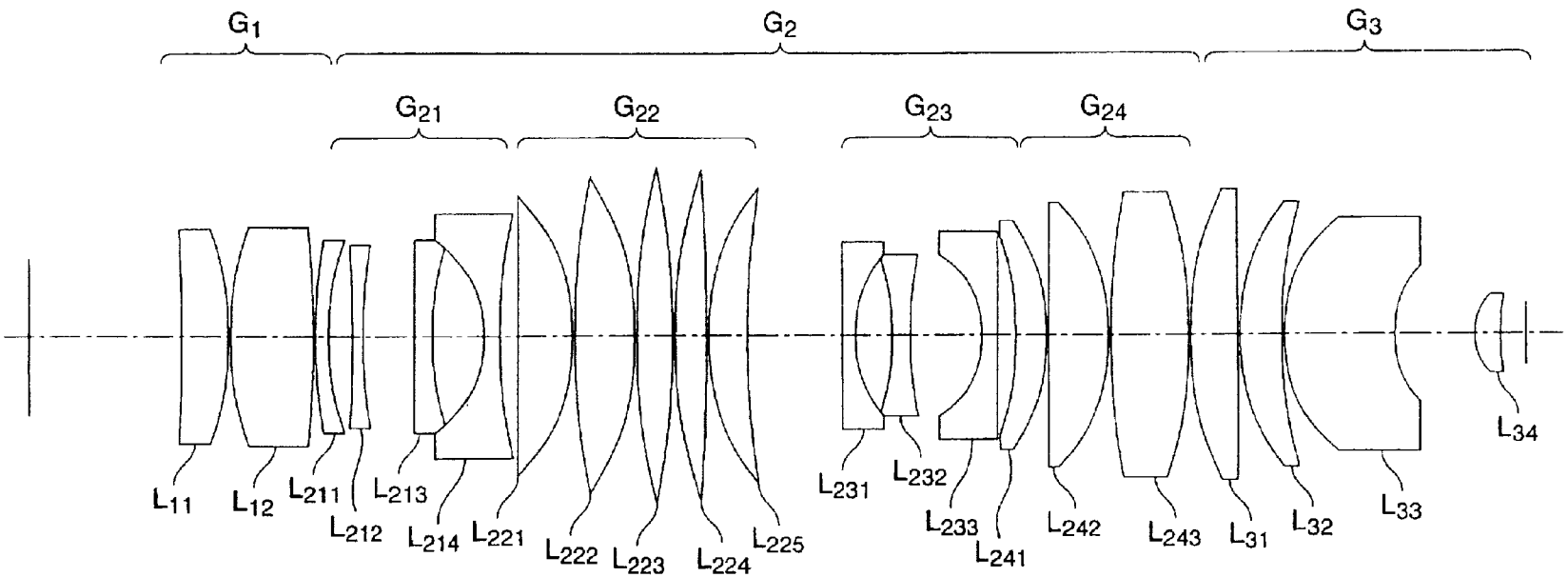
FIG. 12 shows the lens arrangement of the fourth embodiment according to the present invention.

The projection optical system according to the fourth embodiment shown in FIG. 12 has the specification that stipulates that the distance between the object and the image L is 1000, the numerical aperture NA on the image side is 0.60, the projection magnification B is ¼, and the diameter of the exposure area on the wafer W is 20.0.

A concrete lens arrangement of the fourth embodiment is, as shown in FIG. 12, basically identical to that of the aforementioned third embodiment.

Figure 13:
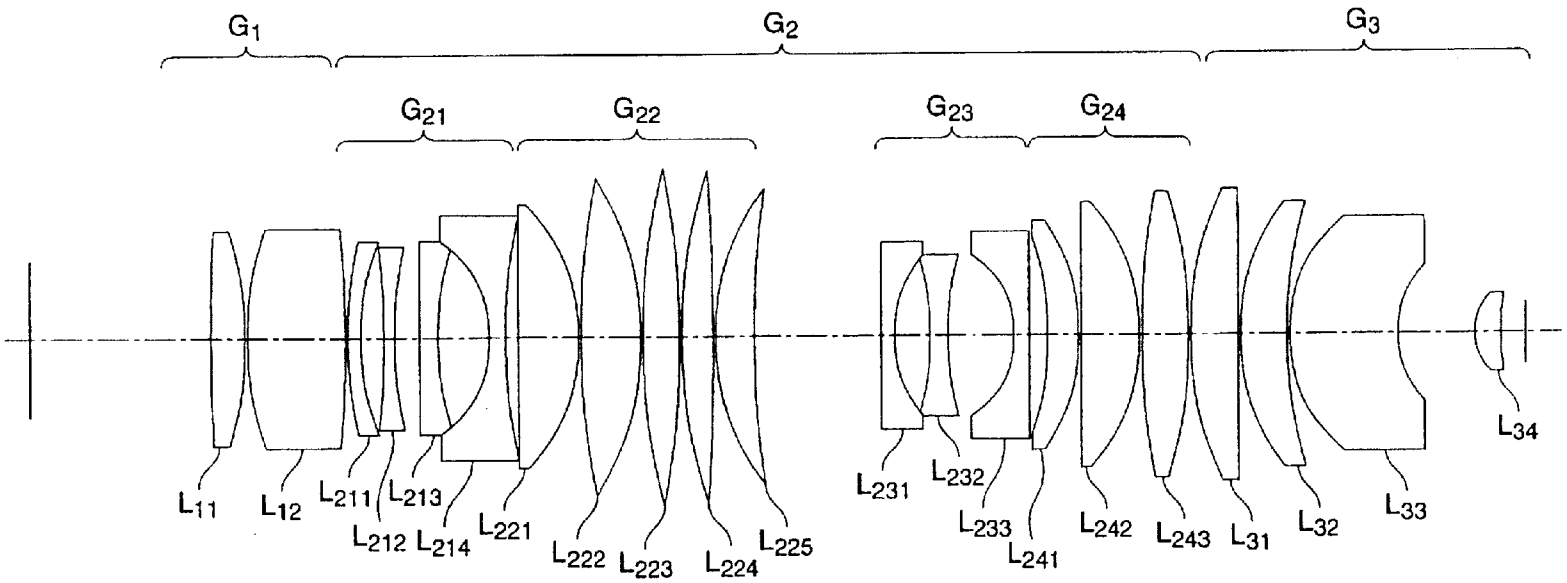
FIG. 13 shows the lens arrangement of the fifth embodiment according to the present invention.
Figure 14:
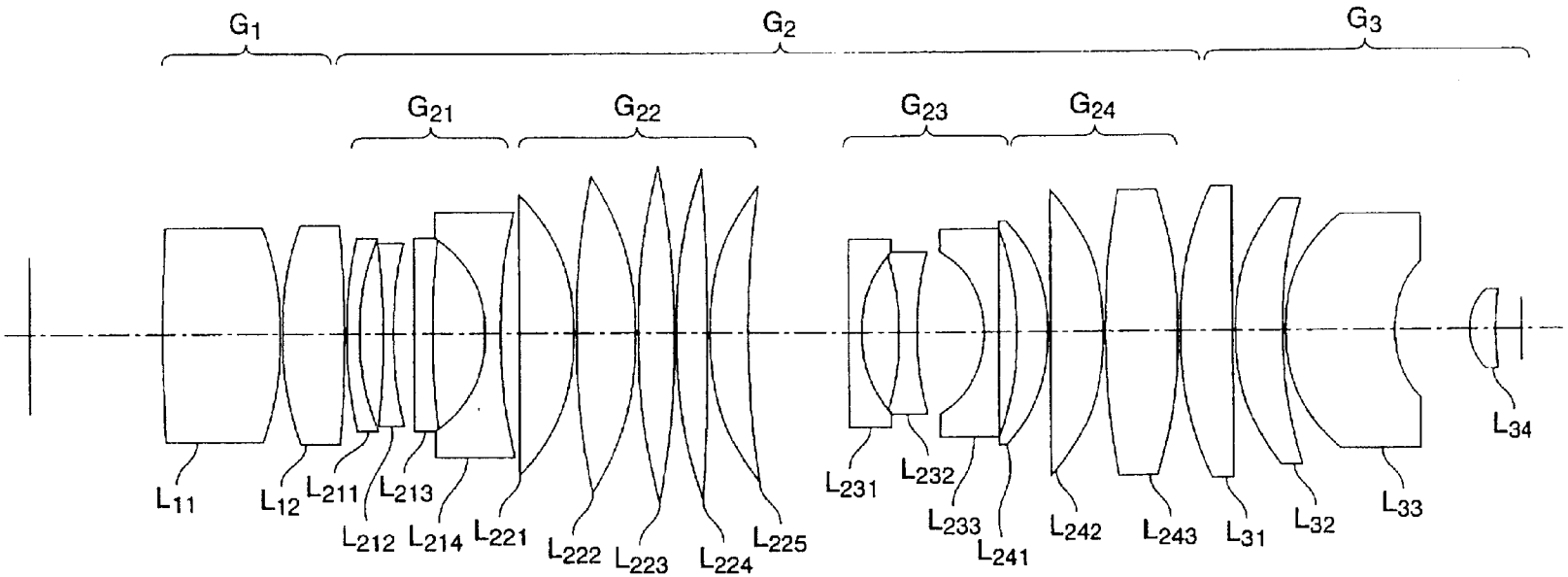
FIG. 14 shows the lens arrangement of the sixth embodiment according to the present invention.
Figure 15:
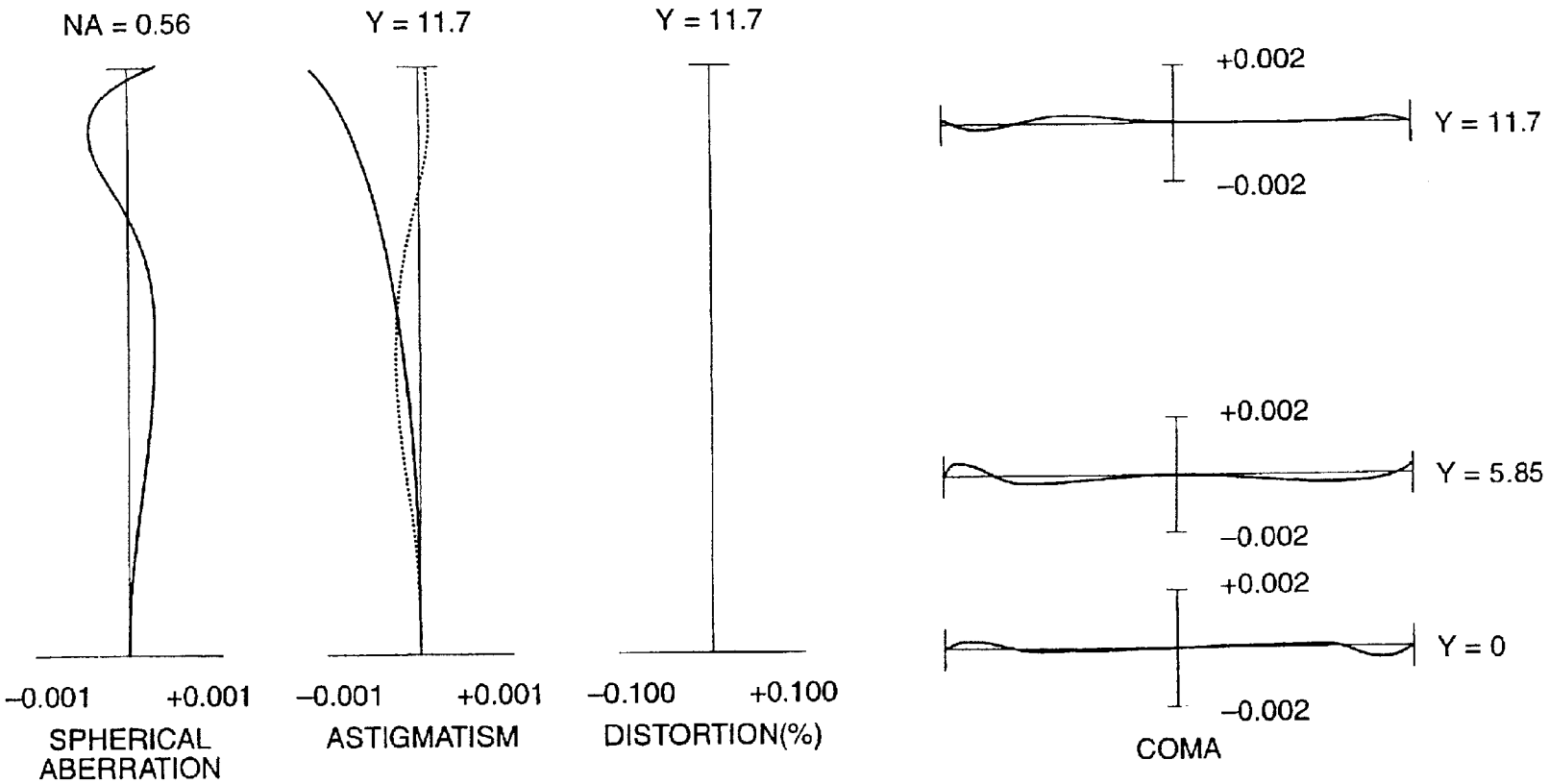
FIG. 15 shows the various aberrations of the first embodiment according to the present invention.
Figure 16:
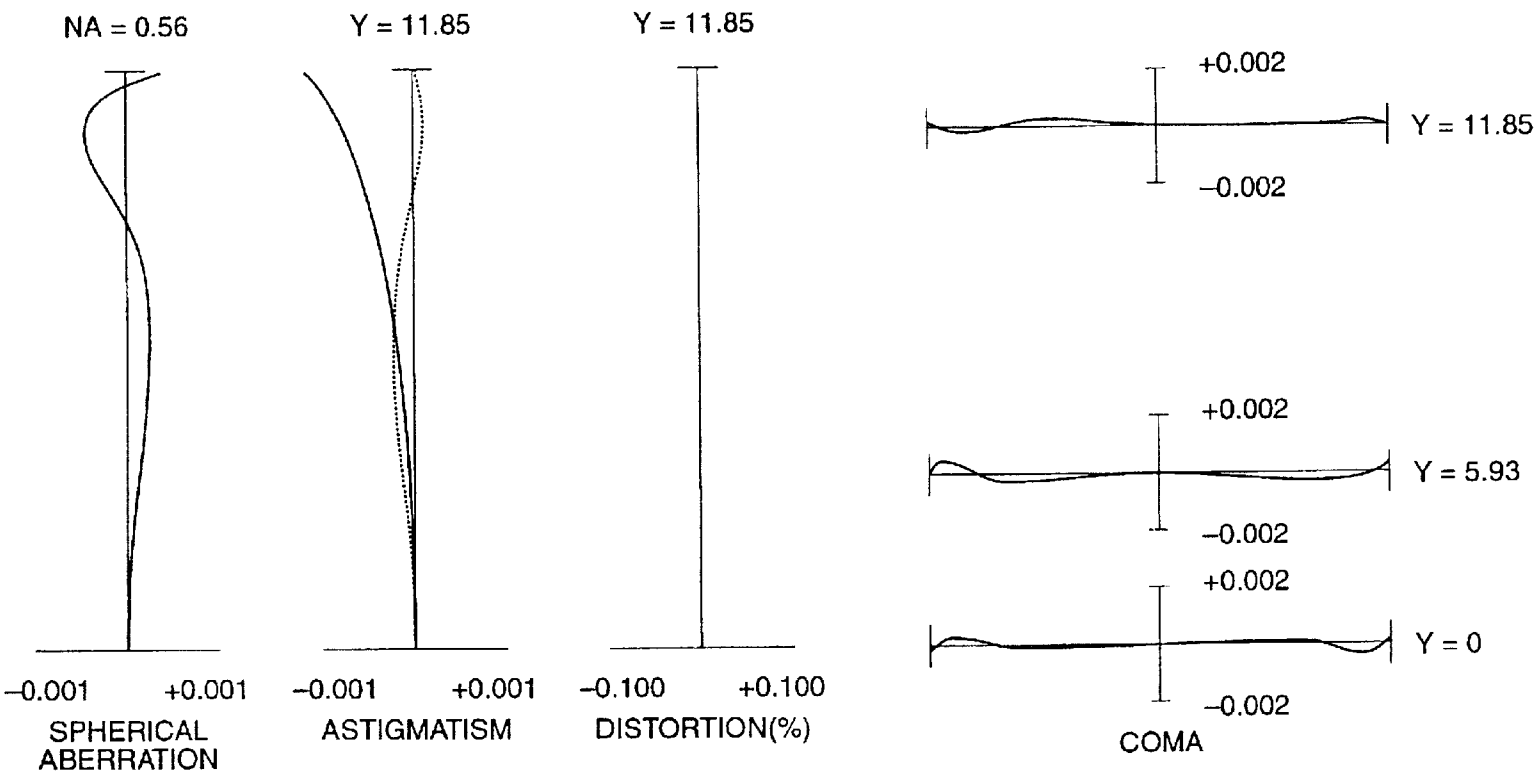
FIG. 16 shows the various aberrations of the second embodiment according to the present invention.
Figure 17:
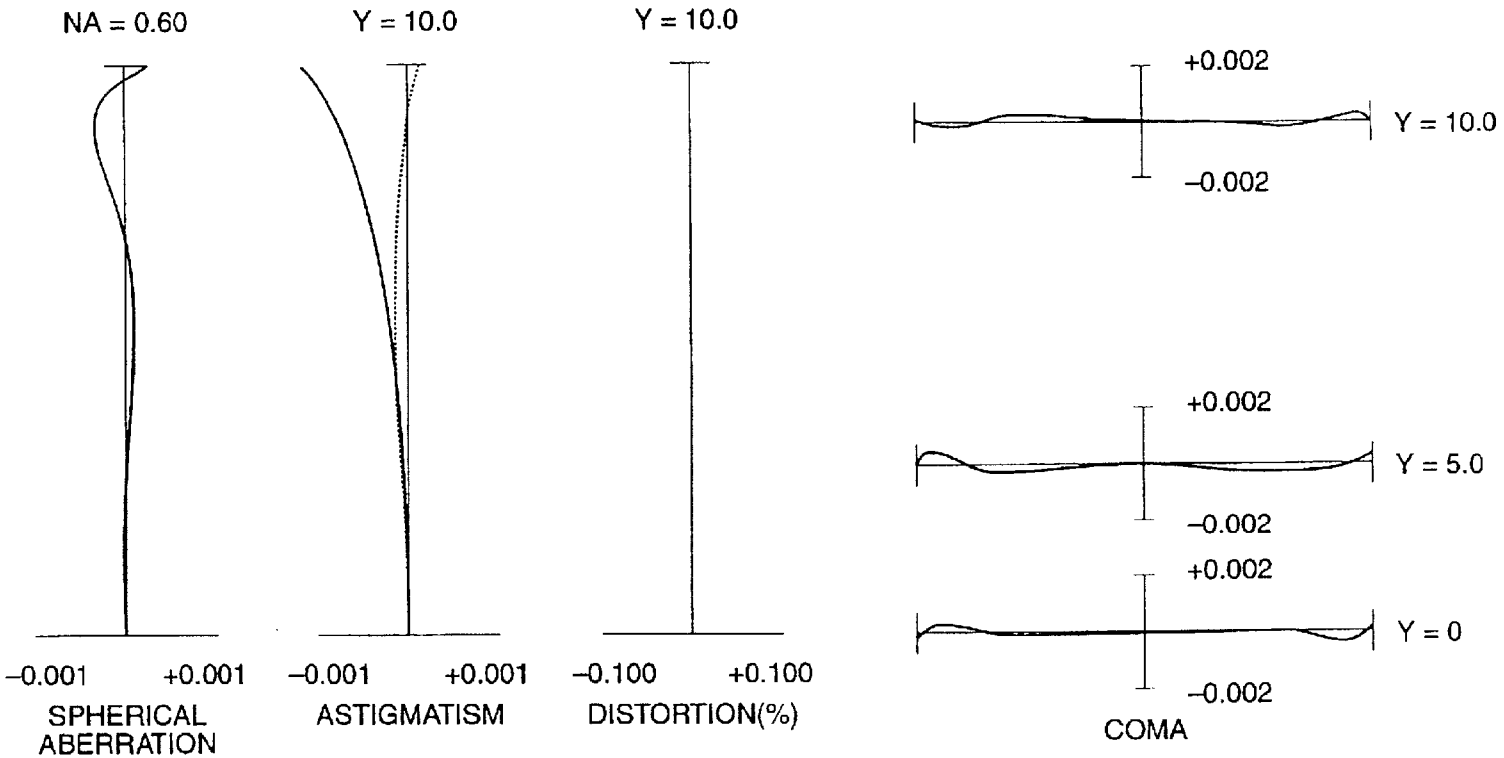
FIG. 17 shows the various aberrations of the third embodiment according to the present invention.
Figure 18:
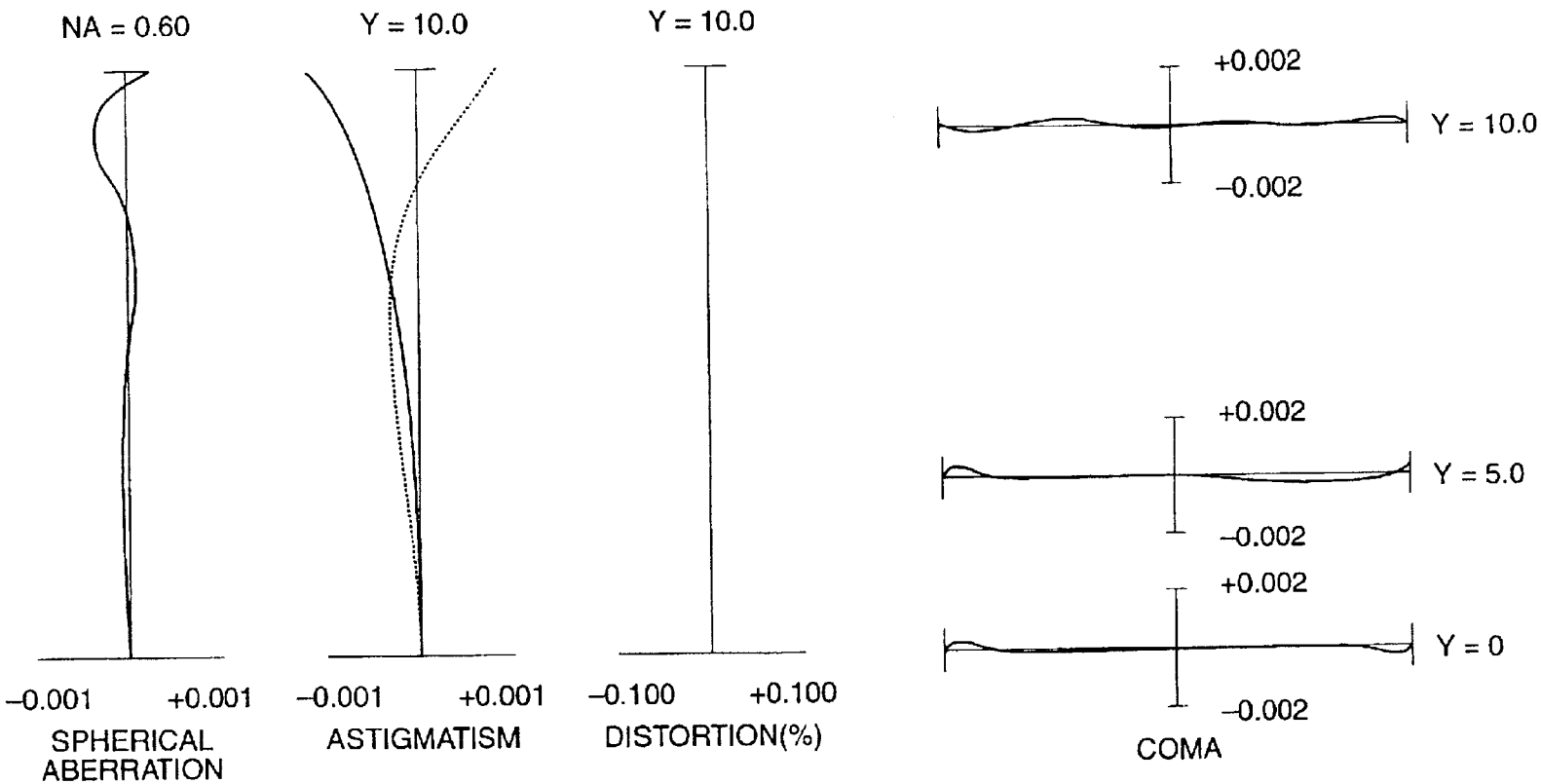
FIG. 18 shows the various aberrations of the fourth embodiment according to the present invention.
Figure 19:
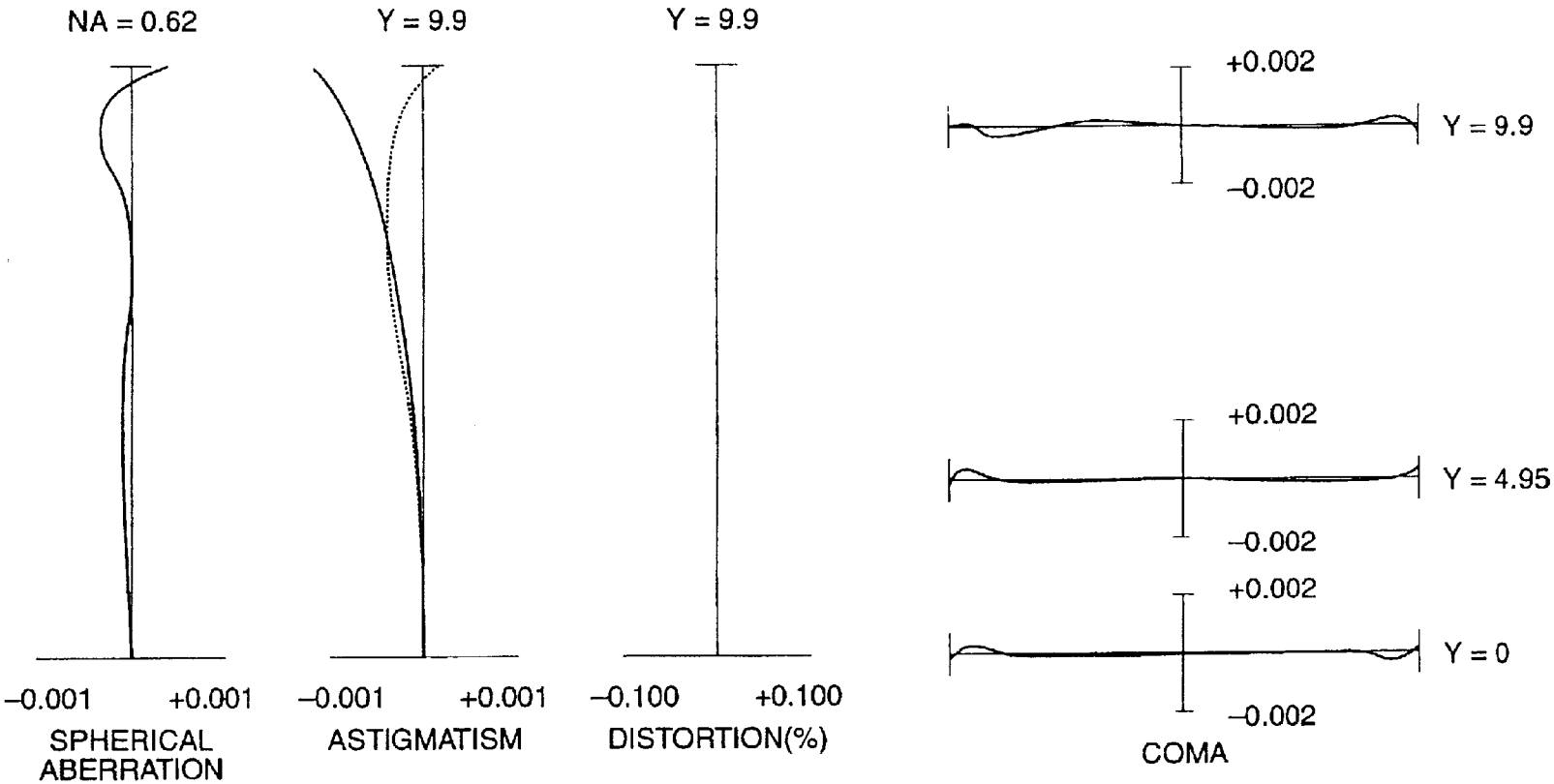
FIG. 19 shows the various aberrations of the fifth embodiment according to the present invention.
Figure 20:
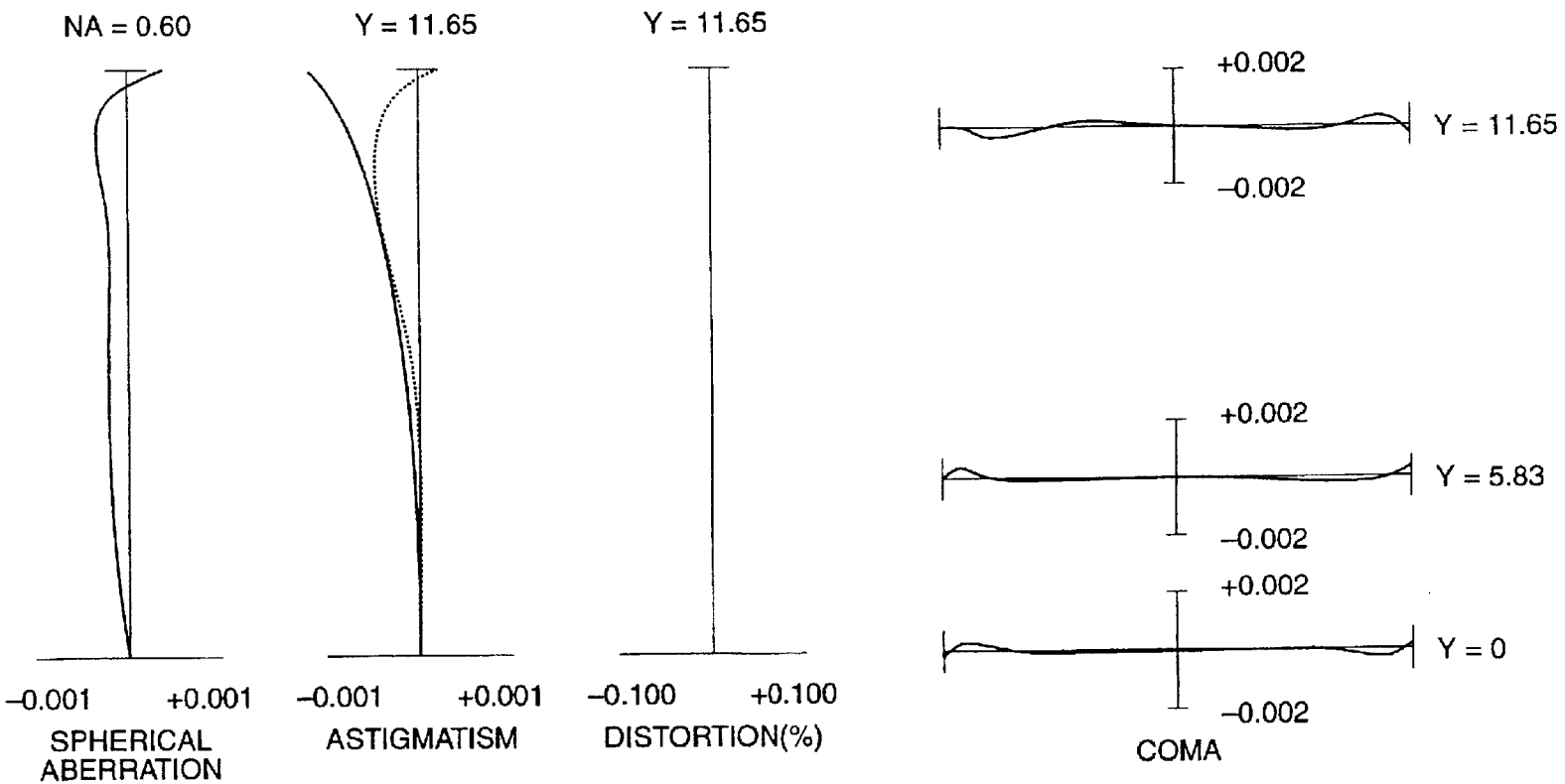
FIG. 20 shows the various aberrations of the sixth embodiment according to the present invention.

Also, the projection optical system according to the fifth embodiment as shown in FIG. 13 has the specification of the distance between object and the image L of 1000, the numerical aperture NA on the image side of 0.62, the projection magnification B of ¼, and the diameter of the exposure area on the wafer W of 19.8.

A concrete lens arrangement of the fifth embodiment is, as shown in FIG. 13, basically identical to that of the aforementioned first embodiment, but the lens surface on the image side (wafer side) of the positive lens $L_{34}$ with its convex surface facing the object side which is the fourth in the third group of lenses G3 is aspherical.

Also, the projection optical system according to the sixth embodiment has the specification which stipulates that the distance between the object and the image L is 1000, the numerical aperture NA on the image side is 0.6, the projection magnification B is ¼, and the diameter of the exposure area on the wafer W is 23.3.

A concrete lens arrangement of the sixth embodiment is as shown in FIG. 13. An similar to that of the fifth embodiment, the lens surface on the image side (wafer side) of the positive lens with its concave facing the object side which is the fourth in the third group of lenses G3 is aspherical.

Now, in the following, various values of each of embodiments and the numeric values corresponding to Conditions according to the present invention will be listed.

This is providing that, the numbers on the left express the surface number from the object side (reticle side), r expresses the curvature radius of the lens surface, d expresses the space between the lens surfaces, n expresses a refractive index of fused silica $SiO_2$ when the exposure wavelength $\lambda$ is 248 nm, $d_O$ expresses the distance from the object (reticle) to the lens surface (the first lens surface) closest to the object side (reticle side) in the first group of lenses G1, B expresses the projection magnification ratio of the projection optical system, NA is a numerical aperture on the image side of the projection optical system, F is the focal length of the entire system, L expresses the distance between the object plane (reticle plane) and the image plane (wafer side), e expresses the distance between the incident point position of the projection optical system, being determined when the ray from the image side (wafer side) of the projection optical system that is parallel to the optical axis of the projection optical system is incident on the projection optical system, and the object plane (reticle plane), h expresses the height of the ray from the optical axis of the projection optical system, when the ray being parallel to the optical axis of the projection optical system is incident on the projection optical system from the image side (wafer side) of the projection optical system, determining the incident point position of the projection optical system, and eventually reaching the object (reticle), H expresses the maximum height of the object (reticle) from the optical axis of the projection optical system, $f_1$ expresses the focal length of the first group of lenses G1, $f_2$ expresses the focal length of the second group of lenses G2, $f_3$ expresses the focal length of the third group of lenses G3, $f_{21}$ expresses the focal length of the first group of sub lenses G21, $f_{22}$ expresses the focal length of the second group of sub lenses G22, $f_{23}$ expresses the focal length of the third group of sub lenses, G23, $\mu_1$ expresses the angle of incident of the paraxial marginal ray as the paraxial marginal ray from the axial object point (reticle center) enters the first group of the lenses G1 on the object (reticle), $u_2$ expresses the angle of incident of the paraxial marginal ray as the paraxial marginal ray from the axial object point (reticle center) enters the second group of the lenses G2 on the object (reticle), $u_2'$ expresses the angle of emergence of the paraxial marginal ray as the paraxial marginal ray from the axial object point (reticle center) emerges from the second group of the lenses G2 on the object (reticle), $u_3'$ expresses an angle of emergence of the paraxial marginal ray as the paraxial marginal ray from the axial object point (the center of the reticle) emerges from the third group of the lenses G3 on the object (reticle), and AS expresses an aperture stop position by showing its distance from the vertex of the lens whose number is shown in parenthesis.

Furthermore, the projection optical system according to the fifth and the sixth embodiments has a part of its surfaces being aspherical, and this aspherical surface can be expressed as follows $$x=(y^2/r)/[1+(1-k(y^2/r^2))^{0.5}]+A4\cdot y^4+A6\cdot y^6+A8\cdot y^8+A10\cdot y^{10},$$

wherein the direction of the optical axis is represented by x, and the direction crossing the optical axis at right angles is represented by y.

This is provided that k expresses a conic constant, A4, A6, A8 and A10 express aspherical coefficients, and r expresses paraxial radius of curvature. Only cone constant k and aspherical coefficient (A4, A6, A8, A10) are shown in the values of the various items in the fifth and the sixth embodiments.

[The First Embodiment]

| | r | d | n |
|---|---|---|---|
| 1 | −617.8800 | 30.375 | 1.5084 |
| 2 | −207.0893 | 0.934 | |
| 3 | 201.9739 | 68.636 | 1.5084 |
| 4 | −416.6217 | 0.865 | |
| 5 | 460.0439 | 7.061 | 1.5084 |
| 6 | 179.6999 | 15.608 | |
| 7 | −373.0162 | 6.952 | 1.5084 |
| 8 | 249.4960 | 30.983 | |
| 9 | −2591.2236 | 11.541 | 1.5084 |
| 10 | 229.2357 | 33.165 | |
| 11 | −82.3025 | 11.524 | 1.5084 |
| 12 | 569.8191 | 9.159 | |
| 13 | 5523.6251 | 36.703 | 1.5084 |
| 14 | −156.8200 | 0.889 | |
| 15 | 610.3354 | 41.168 | 1.5084 |
| 16 | −221.8862 | 0.883 | |
| 17 | 528.5938 | 26.903 | 1.5084 |
| 18 | −570.2004 | 0.883 | |
| 19 | 423.5775 | 21.883 | 1.5084 |
| 20 | −1396.2999 | 0.883 | |
| 21 | 203.9075 | 22.715 | 1.5084 |
| 22 | 835.4548 | 67.972 | |
| 23 | −735.8990 | 8.386 | 1.5084 |
| 24 | 104.6386 | 23.616 | |
| 25 | −184.6683 | 11.034 | 1.5084 |
| 26 | 288.7053 | 58.171 | |
| 27 | −74.5663 | 11.343 | 1.5084 |
| 28 | 2318.9745 | 11.371 | |
| 29 | −283.4504 | 22.211 | 1.5084 |
| 30 | −142.5176 | 1.323 | |
| 31 | −5670.4690 | 39.484 | 1.5084 |
| 32 | −146.6908 | 0.883 | |
| 33 | 654.7531 | 37.168 | 1.5084 |
| 34 | −347.7071 | 0.883 | |
| 35 | 254.9142 | 31.600 | 1.5084 |
| 36 | 2133.1980 | 0.883 | |
| 37 | 164.8042 | 27.885 | 1.5084 |
| 38 | 349.3775 | 0.884 | |
| 39 | 108.9816 | 73.045 | 1.5084 |
| 40 | 75.6698 | 54.069 | |
| 41 | 46.2841 | 16.956 | 1.5084 |
| 42 | 99.3161 | 13.169 | |

d0 = 107.954, B = 1/4, NA = 0.56, |F/(B · L)| = 8.563,
|h/e| = 2.790/1000, |BH/F| = 5.465/1000
|Fh/(BHe)| = 0.511, f3/f1 = 0.847, f1/L = 0.191,
H/L = 0.0468, |f22/f21| = 1.890, |f23/L| = 0.0422,
|fa/f23| = 4.472,
(L/f1) + (L/f3) + Σ(L/f2i) = (L/f1) + (L/f3) + (L/f21) + (L/f22) + (L/f23) + (L/f24) = −14.110,
|u2/u1| = 0.257, |u2'/u3'| = 0.119,
|f2|/f1 = 1.803, |f2|/f3 = 2.128
AS = −0.759 (30)

[The Second Embodiment]

| | r | d | n |
|---|---|---|---|
| 1 | −918.0100 | 29.281 | 1.5084 |
| 2 | −226.7230 | 1.015 | |
| 3 | 197.5077 | 35.504 | 1.5084 |
| 4 | −436.3992 | 0.900 | |
| 5 | 401.4765 | 25.145 | 1.5084 |
| 6 | 169.5548 | 14.473 | |
| 7 | −466.0571 | 7.085 | 1.5084 |
| 8 | 220.0642 | 25.179 | |
| 9 | −2519.6149 | 11.761 | 1.5084 |
| 10 | 225.1572 | 46.410 | |
| 11 | −83.4467 | 11.744 | 1.5084 |
| 12 | 575.7315 | 10.248 | |
| 13 | 4614.1788 | 34.259 | 1.5084 |
| 14 | −159.8067 | 0.906 | |
| 15 | 630.2516 | 42.049 | 1.5084 |
| 16 | −224.4420 | 0.900 | |
| 17 | 525.5979 | 27.738 | 1.5084 |
| 18 | −577.7859 | 0.900 | |
| 19 | 421.4433 | 22.686 | 1.5084 |
| 20 | −1393.5376 | 0.900 | |
| 21 | 207.4893 | 29.821 | 1.5084 |
| 22 | 827.0193 | 58.785 | |
| 23 | −787.7625 | 8.546 | 1.5084 |
| 24 | 104.7597 | 24.059 | |
| 25 | −195.7892 | 11.245 | 1.5084 |
| 26 | 291.7525 | 60.021 | |
| 27 | −75.8912 | 11.560 | 1.5084 |
| 28 | 2363.2066 | 11.580 | |
| 29 | −287.0462 | 22.500 | 1.5084 |
| 30 | −145.9749 | 1.348 | |
| 31 | −5220.9017 | 40.372 | 1.5084 |
| 32 | −149.1133 | 0.900 | |
| 33 | 669.4812 | 34.560 | 1.5084 |
| 34 | −352.4399 | 0.900 | |
| 35 | 259.9778 | 32.204 | 1.5084 |
| 36 | 2252.3734 | 0.900 | |
| 37 | 168.0113 | 28.182 | 1.5084 |
| 38 | 357.0361 | 0.901 | |
| 39 | 111.0821 | 74.558 | 1.5084 |
| 40 | 77.6094 | 54.365 | |
| 41 | 48.1923 | 18.000 | 1.5084 |
| 42 | 104.8219 | 13.194 | |

d0 = 112.420, B = 1/4, NA = 0.56, |F/(B · L)| = 7.401,
|h/e| = 2.911/1000, |BH/F| = 6.405/1000
|Fh/(BHe)| = 0.454, f3/f1 = 0.882, f1/L = 0.186,
H/L = 0.0474, |f22/f21| = 1.913, |f23/L| = 0.0430,
|fa/f23 = 4.433,
(L/f1) + (L/f3) + Σ(L/f2i) = (L/f1) + (L/f3) + (L/f21) + (L/f22) + (L/f23) + (L/f24) = −13.901,
|u2/u1| = 0.252, |u2'/u3'| = 0.118,
|f2|/f1 = 1.835, |f2|/f3 = 2.079
AS = −5.584 (30)

[The Third Embodiment]

| | r | d | n |
|---|---|---|---|
| 1 | −597.3748 | 25.242 | 1.5084 |
| 2 | −200.9166 | 0.911 | |
| 3 | 196.2951 | 67.818 | 1.5084 |
| 4 | −409.7939 | 0.844 | |
| 5 | 529.6446 | 6.007 | 1.5084 |
| 6 | 181.3119 | 14.179 | |
| 7 | −356.9113 | 6.776 | 1.5084 |
| 8 | 259.7156 | 29.718 | |
| 9 | −1951.4288 | 11.249 | 1.5084 |
| 10 | 224.0588 | 33.845 | |
| 11 | −80.3909 | 11.233 | 1.5084 |
| 12 | 559.5923 | 8.464 | |
| 13 | 7435.8600 | 38.209 | 1.5084 |
| 14 | −154.1071 | 0.867 | |
| 15 | 578.7376 | 41.988 | 1.5084 |
| 16 | −221.7634 | 0.860 | |
| 17 | 520.2543 | 27.091 | 1.5084 |
| 18 | −580.8810 | 0.860 | |
| 19 | 434.8497 | 21.591 | 1.5084 |
| 20 | −1469.6787 | 0.860 | |
| 21 | 203.8777 | 23.215 | 1.5084 |
| 22 | 822.6243 | 71.754 | |
| 23 | −778.1701 | 8.174 | 1.5084 |

-continued

| | | | |
|---|---|---|---|
| 24 | 100.2296 | 24.584 | |
| 25 | −182.2880 | 10.755 | 1.5084 |
| 26 | 332.2997 | 53.448 | |
| 27 | −72.2384 | 11.056 | 1.5084 |
| 28 | 2288.1473 | 11.500 | |
| 29 | −297.2735 | 22.609 | 1.5084 |
| 30 | −139.2217 | 1.289 | |
| 31 | −5373.4418 | 36.531 | 1.5084 |
| 32 | −145.1851 | 0.860 | |
| 33 | 638.7734 | 54.278 | 1.5084 |
| 34 | −341.5270 | 0.860 | |
| 35 | 247.9732 | 26.877 | 1.5084 |
| 36 | 1983.1986 | 0.860 | |
| 37 | 160.1370 | 28.237 | 1.5084 |
| 38 | 339.1395 | 0.862 | |
| 39 | 106.1048 | 70.038 | 1.5084 |
| 40 | 73.3426 | 54.566 | |
| 41 | 44.7083 | 16.217 | 1.5084 |
| 42 | 95.4941 | 12.459 | |

d0 = 110.356, B = 1/4, NA = 0.60, |F/(B · L)| = 10.143,
|h/e| = 1.341/1000, |BH/F| = 3.943/1000
|Fh/(BHe)| = 0.340, f3/fl = 0.849, f1/L = 0.187,
H/L = 0.0400, |f22/f21| = 1.945, |f23/L| = 0.0420,
|fa/f23| = 4.450,
(L/f1) + (L/f3) + Σ(L/f2i) = (L/f1) + (L/f3) + (L/f21) + (L/f22) + (L/f23) + (L/f24) = −14.386,
|u2/u1| = 0.249, |u2'/u3'| = 0.124,
|f2|/f1 = 1.747, |f2|/f3 = 2.058
AS = −27.149 (32)

[The Fourth Embodiment]

| | r | d | n |
|---|---|---|---|
| 1 | −640.8560 | 25.052 | 1.5084 |
| 2 | −201.3946 | 0.916 | |
| 3 | 200.8206 | 55.783 | 1.5084 |
| 4 | −426.0199 | 0.848 | |
| 5 | 552.0410 | 10.513 | 1.5084 |
| 6 | 181.9271 | 18.101 | |
| 7 | −362.9705 | 6.813 | 1.5084 |
| 8 | 272.4238 | 31.271 | |
| 9 | −1373.4347 | 11.310 | 1.5084 |
| 10 | 231.8733 | 33.558 | |
| 11 | −80.6736 | 11.294 | 1.5084 |
| 12 | 561.4486 | 8.395 | |
| 13 | 7776.9451 | 39.474 | 1.5084 |
| 14 | −155.3822 | 0.871 | |
| 15 | 578.3969 | 42.753 | 1.5084 |
| 16 | −224.7120 | 0.865 | |
| 17 | 519.4619 | 27.661 | 1.5084 |
| 18 | −585.1361 | 0.865 | |
| 19 | 434.8598 | 21.928 | 1.5084 |
| 20 | −1518.8470 | 0.865 | |
| 21 | 204.6036 | 23.631 | 1.5084 |
| 22 | 817.4877 | 71.724 | |
| 23 | −793.6290 | 8.218 | 1.5084 |
| 24 | 100.6732 | 25.059 | |
| 25 | −181.6364 | 10.814 | 1.5084 |
| 26 | 342.5369 | 53.305 | |
| 27 | −72.5780 | 11.116 | 1.5084 |
| 28 | 2312.7950 | 11.602 | |
| 29 | −301.4732 | 22.614 | 1.5084 |
| 30 | −140.2430 | 1.296 | |
| 31 | −5376.0587 | 36.747 | 1.5084 |
| 32 | −146.2354 | 0.865 | |
| 33 | 641.9743 | 49.864 | 1.5084 |
| 34 | −344.2090 | 0.865 | |
| 35 | 249.0052 | 27.017 | 1.5084 |
| 36 | 1968.1030 | 0.865 | |
| 37 | 160.7579 | 28.435 | 1.5084 |
| 38 | 341.1087 | 0.867 | |
| 39 | 106.4499 | 70.093 | 1.5084 |
| 40 | 73.6346 | 54.900 | |
| 41 | 44.8018 | 16.645 | 1.5084 |
| 42 | 96.0196 | 12.413 | |

d0 = 111.911, B = 1/4, NA = 0.60, |F/(B · L)| = 9.430,
|h/e| = 1.458/1000, |BH/F| = 4.242/1000,
|Fh/(BHe)| = 0.344, f3/fl = 0.848, f1/L = 0.187,

-continued

H/L = 0.0400, |f22/f21| = 1.963, |f23/L| = 0.0423,
|fa/f23| = 4.447,
(L/f1) + (L/f3) + Σ(L/f2i) = (L/f1) + (L/f3) + (L/f21) + (L/f22) + (L/f23) + (L/f24) = −14.363
|u2/u1| = 0.255, |u2'/u3'| = 0.123,
|f2|/f1 = 1.752, |f2|/f3 = 2.065
AS = −29.928 (32)

[The Fifth Embodiment]

| | r | d | n |
|---|---|---|---|
| 1 | 930.3000 | 23.651 | 1.5084 |
| 2 | −278.6119 | 0.903 | |
| 3 | 223.9529 | 64.885 | 1.5084 |
| 4 | −615.0526 | 0.837 | |
| 5 | 338.2442 | 5.968 | 1.5084 |
| 6 | 119.1255 | 18.260 | |
| 7 | −457.7663 | 6.722 | 1.5084 |
| 8 | 521.2617 | 15.918 | |
| 9 | −470.3372 | 11.159 | 1.5084 |
| 10 | 329.2273 | 32.346 | |
| 11 | −79.8352 | 11.143 | 1.5084 |
| 12 | 545.0078 | 7.974 | |
| 13 | 7884.3462 | 44.592 | 1.5084 |
| 14 | −155.3686 | 0.860 | |
| 15 | 560.1230 | 43.244 | 1.5084 |
| 16 | −235.1212 | 0.854 | |
| 17 | 493.3688 | 29.453 | 1.5084 |
| 18 | −576.3608 | 0.854 | |
| 19 | 413.6605 | 22.508 | 1.5084 |
| 20 | −1827.7591 | 0.854 | |
| 21 | 210.0563 | 23.049 | 1.5084 |
| 22 | 787.2641 | 71.559 | |
| 23 | −855.8139 | 8.109 | 1.5084 |
| 24 | 98.8737 | 27.165 | |
| 25 | −153.2442 | 10.669 | 1.5084 |
| 26 | 417.3767 | 52.341 | |
| 27 | −72.4729 | 10.968 | 1.5084 |
| 28 | 2643.0756 | 11.192 | |
| 29 | −322.1126 | 22.704 | 1.5084 |
| 30 | −137.8365 | 1.279 | |
| 31 | −5876.7456 | 34.318 | 1.5084 |
| 32 | −147.0938 | 0.854 | |
| 33 | 628.2663 | 32.223 | 1.5084 |
| 34 | −345.6471 | 0.854 | |
| 35 | 243.4254 | 26.062 | 1.5084 |
| 36 | 1821.2525 | 0.854 | |
| 37 | 156.8171 | 36.395 | 1.5084 |
| 38 | 338.0123 | 0.855 | |
| 39 | 104.7020 | 64.828 | 1.5084 |
| 40 | 72.3277 | 51.845 | |
| 41 | 45.4012 | 20.617 | 1.5084 |
| 42 | 98.9903 | 9.870 | |

The 42nd Surface (Aspherical)

k = 0.6624700
A4 = 0.6179381 × $10^{-7}$
A6 = −0.3925351 × $10^{-9}$
A8 = 0.1585343 × $10^{-11}$
A10 = −0.1843319 × $10^{-14}$
d0 = 138.409, B = 1/4, NA = 0.62, |F/(B · L)| = 16.387,
|h/e| = 1.915/1000, |BH/F| = 2.416/1000,
|Fh/(BHe)| = 0.792, f3/fl = 0.813, f1/L = 0.190,
H/L = 0.0396, |f22/f21| = 1.891, |f23/L| = 0.0414,
|fa/f23| = 4.574,
(L/f1) + (L/f3) + Σ(L/f2i) = (L/f1) + (L/f3) + (L/f21) + (L/f22) + (L/f23) + (L/f24) = −13.746,
|u2/u1| = 0.160, |u2'/u3'| = 0.125,
|f2|/f1 = 1.825, |f2|/f3 = 2.245
AS = −8.876 (30)

[The Sixth Embodiment]

| | r | d | n |
|---|---|---|---|
| 1 | 1043.7100 | 88.597 | 1.5084 |
| 2 | −251.9259 | 0.869 | |
| 3 | 214.6715 | 45.354 | 1.5084 |

-continued

| | | | |
|---|---|---|---|
| 4 | −527.5931 | 0.805 | |
| 5 | 339.0410 | 7.148 | 1.5084 |
| 6 | 119.9769 | 20.589 | |
| 7 | −513.5016 | 6.469 | 1.5084 |
| 8 | 370.4852 | 14.053 | |
| 9 | −493.2523 | 10.739 | 1.5084 |
| 10 | 311.7938 | 36.894 | |
| 11 | −78.7992 | 10.724 | 1.5084 |
| 12 | 535.3653 | 8.195 | |
| 13 | 6096.2460 | 39.479 | 1.5084 |
| 14 | −151.8460 | 0.827 | |
| 15 | 541.8596 | 48.739 | 1.5084 |
| 16 | −231.6198 | 0.821 | |
| 17 | 468.0735 | 38.476 | 1.5084 |
| 18 | −550.7152 | 0.821 | |
| 19 | 391.2085 | 25.660 | 1.5084 |
| 20 | −1843.0508 | 0.821 | |
| 21 | 201.4257 | 24.826 | 1.5084 |
| 22 | 763.0175 | 63.432 | |
| 23 | −850.6670 | 7.804 | 1.5084 |
| 24 | 94.7518 | 27.586 | |
| 25 | −145.5262 | 10.268 | 1.5084 |
| 26 | 410.8385 | 48.747 | |
| 27 | −69.9031 | 10.555 | 1.5084 |
| 28 | 2477.5890 | 10.405 | |
| 29 | −311.1732 | 22.756 | 1.5084 |
| 30 | −131.8814 | 1.231 | |
| 31 | −6862.7408 | 32.505 | 1.5084 |
| 32 | −142.2005 | 0.821 | |
| 33 | 594.5368 | 44.464 | 1.5084 |
| 34 | −336.9460 | 0.821 | |
| 35 | 233.2823 | 30.775 | 1.5084 |
| 36 | 1678.8294 | 0.821 | |
| 37 | 150.4910 | 33.272 | 1.5084 |
| 38 | 322.4344 | 0.823 | |
| 39 | 100.4797 | 61.637 | 1.5084 |
| 40 | 70.0396 | 50.454 | |
| 41 | 44.7238 | 18.586 | 1.5084 |
| 42 | 93.5811 | 10.952 | |

The 42nd Surface (Aspherical)

$k = -0.2403500$
$A4 = 0.2796584 \times 10^{-6}$
$A6 = -0.2375848 \times 10^{-9}$
$A8 = 0.1012624 \times 10^{-11}$
$A10 = -0.9704745 \times 10^{-15}$
$d0 = 80.374$, $B = 1/4$, $NA = 0.60$, $|F/(B \cdot L)| = 7.991$,
$|h/e| = 2.922/1000$, $|BH/F| = 5.832/1000$,
$|Fh/(BHe)| = 0.501$, $f3/fl = 0.843$, $f1/L = 0.181$,
$H/L = 0.0466$, $|f22/f21| = 1.981$, $|f23/L| = 0.0398$,
$|fa/f23| = 4.536$,
$(L/f1) + (L/f3) + \Sigma(L/f2i) = (L/f1) + (L/f3) + (L/f21) + (L/f22) + (L/f23) + (L/f24) = -14.908$,
$|u2/u1| = 0.217$, $|u2'/u3'| = 0.126$,
$|f2|/f1 = 1.755$, $|f2|/f3 = 2.081$
$AS = -3.358$ (30)

From the above values of various elements from an each of the embodiments, it is understood that the optical system with extremely small deviation from telecentricity both on the object side (reticle side) and on the image side (wafer side) has been accomplished, while maintaining a relatively large exposure area and the high numerical aperture NA of 0.56 or more, in spite of the configuration comprising relatively small number of the lenses and the compactness of the overall system.

Also, FIGS. 15, 16, 17, 18, 19 and 20 show various aberrations in the first to the sixth embodiments.

In each aberrational figures, NA expresses the numerical aperture of the projection optical system, Y expresses the height of the image, and in the astigmatic aberrational figures, a dashed line expresses the meridional image surface, and the solid line expresses the sagittal image surface.

From the comparison of each of the aberrational figures, it can be understood that a projection optical system with high resolution with high numerical aperture of 0.56 or more is being achieved, while various aberrations are corrected in a well-balanced manner in each of the embodiments. Distortion, in particular, is corrected favorably to the extent where it is nearly zero over the entire image.

Furthermore, in each of the above mentioned embodiments, examples wherein the second group of lenses G2 comprises a group of 4 sub lenses of negative, positive, negative, and positive are shown, however, it is needless to say that the second group of lenses G2 can be composed by a group of 3 sub lenses of negative, positive, and negative.

Also, the refractive power in the second group of lenses G2 in each of the above mentioned embodiments has relatively weak positive refractive power, however, it is of course appropriate to compose the second group of lenses G2 with zero refractive power, or relatively weak negative refractive power.

Furthermore, in each of the above mentioned embodiments, only a single optical material, namely, quartz ($SiO_2$), is used as an optical material to compose the projection optical system, however, if an exposure light has a certain half-value band width, then it is possible to combine quartz ($SiO_2$) and fluorite ($C_aF_2$) to correct chromatic aberration, and furthermore, it is possible to correct chromatic aberration by combining other optical materials through which ultraviolet ray can pass.

Also, in the fifth and sixth embodiments, only one surface of the last lens in the third group of lenses L34 is aspherical, but it is needless to say that if a plural number of lenses are constructed with aspherical surfaces in the projection optical system in each of the embodiments, then the number of optical elements to be used for the entire optical system will be reduced, making it possible to obtain a lighter optical system with higher transmittance, and if the same number of optical elements will be used, higher NA and larger visual field can be achieved.

Also, each of the embodiments has shown examples wherein excimer laser which supplies a ray of 248 nm is used as a light source, but it does not necessarily have to be limited to this, and it is needless to say that mercury-arc lamp which supplies g line (436 nm) and i line (365 nm) and excimer laser which supplies a ray of 193 nm, and furthermore, other light sources which supply ultraviolet ray can also be applied.

Also, it is also possible to use reflective members such as a reflecting mirror in place of a part of the lenses that compose the projection optical system.

Thus, according to each of embodiments in this invention, a projection optical system with high resolution with high numerical aperture wherein various aberrations are corrected in a well-balanced manner can be achieved, while securing relatively large exposure area and maintaining it as an optical system with nearly perfectly small deviation from telecentricity both on the object side (reticle side) and on the image side (wafer side).

And, because an optical system with extremely small deviation from telecentricity, wherein the entrance pupil position of the projection optical system is farther from the object plane (reticle plane), and exit pupil is also farther from the image side (wafer side), can be achieved, image distortion problems due to a curve on the object surface on the image side can be canceled, and furthermore, the load in designing the illumination optical system can be substantially reduced.

Furthermore, not only the lens diameter of the projection optical system but also the length of the overall projection optical system can be shortened.

What is claimed is:

1. A projection optical system that projects an image of an object in an object surface onto an image surface with a predetermined reduction magnification comprising, in light path order from said object surface:

a first group of lenses with positive refractive power, said first group including at least two positive lenses;

a second group of lenses forming an approximately afocal system, said second group including, in light path order from said object surface, a first subgroup of lenses with negative refractive power, said first subgroup including at least two negative lenses, a second subgroup of lenses with positive refractive power, said second subgroup including at least four positive lenses, and a third subgroup of lenses with negative refractive power, said third subgroup including at least two negative lenses; and a third group of lenses with positive refractive power, said third group including at least two positive lenses;

wherein:

said projection optical system has an optical axis, said projection optical system has a focal length F, said projection optical system has a projection magnification B, said object surface and said image surface are separated by a distance L, a ray from said image surface that is parallel to said optical axis and is incident on said projection optical system emerges from said projection optical system along a path and encounters said object surface at a height h from said optical axis, said ray has an extension along said path, which extension crosses said optical axis at a distance e from said object surface, $$1.8 \leqq |F/(B \cdot L)|,$$

and $$|h/e| \leqq 3/1000.$$

2. The projection optical system of claim 1 wherein:

a maximum height of the object from said optical axis is represented by H; and $$|B \bullet H/F| \leqq 8/1000.$$

3. The projection optical system of claim 2 wherein:

$$F \bullet h/(B \bullet H \bullet e) \leqq 4.$$

4. The projection optical system of claim 3 wherein:

said first group of lenses has a focal length $f_1$;

said third group of lenses has a focal length $f_3$; and $$0.80 \leqq |f_3/f_1| \leqq 1.5.$$

5. The projection optical system of claim 4 wherein:

$$0.05 \leqq f_1/L \leqq 0.3.$$

6. The projection optical system of claim 5 wherein:

$$0.03 \leqq H/L \leqq 0.2.$$

7. The projection optical system of claim 1 wherein at least one of said first, second, and third groups of lenses includes an aspherical lens.

8. The projection optical system of claim 1 wherein:

said first subgroup of lenses has a focal length $f_{21}$;

said second subgroup of lenses has a focal length $f_{22}$; and $$1.5 \leqq |f_{22}/f_{21}| \leqq 5.$$

9. The projection optical system of claim 1 wherein:

said third subgroup of lenses has a focal length $f_{23}$; and $$0.02 \leqq |f_{23}/L| \leqq 0.10.$$

10. The projection optical system of claim 9 wherein:

said first group of lenses, said first subgroup of lenses in said second group of lenses, and said second subgroup of lenses in said second group of lenses have a composite focal length $f_a$; and $$4 \leqq |f_a/f_{23}|.$$

11. The projection optical system of claim 10 wherein:

the $i^{th}$ subgroup of lenses of said second group of lenses, in light path order from said object surface, has a focal length $f_{2i}$; and $$-50 \leqq (L/f_1)+(L/f_3)+\Sigma(L/f_{2i}) \leqq 0.5.$$

12. The projection optical system of claim 1 wherein::

said second subgroup of lenses comprises at least two biconcave lenses.

13. The projection optical system of claim 12 wherein:

the paraxial marginal ray from the axial object point on said object surface enters said first group of lenses at an angle of incidence $u_1$;

the paraxial marginal ray from the axial object point on said object surface enters said second group of lenses at an angle of incidence $u_2$;

the paraxial marginal ray from the axial object point on said object surface emerges from said second group of lenses at an angle of emergence $u_2'$;

the paraxial marginal ray from the axial object point on said object surface emerges from said third group of lenses at an angle of emergence $U_3'$;

$$|u_2/u_1| \leqq 0.5;$$

and $$|u_2'/u_3'| \leqq 0.5.$$

14. The projection optical system of claim 13 wherein:

said second group of lenses has a focal length $f_2$;

said third group of lenses has a focal length $f_3$;

$$|f_2|/f_1 > 1;$$

and $$|f_2|/f_3>1.$$

15. The projection optical system of claim 1 wherein said second group of lenses further comprises a fourth subgroup of lenses with positive refractive power.

16. The projection optical system of claim 15 wherein said fourth subgroup of lenses comprises at least two positive lenses.

17. The projection optical system of claim 1 wherein:

said first group of lenses has a focal length $f_1$;

said third group of lenses has a focal length $f_3$; and $$0.80 \leqq |f_3/f_1| \leqq 1.5.$$

18. The projection optical system of claim 17 wherein:

$$0.05 \leqq f_1/L \leqq 0.3.$$

19. The projection optical system of claim 18 wherein:

a maximum height of the object from said optical axis is represented by H; and $$0.03 \leqq H/L \leqq 0.2.$$

20. The projection optical system of claim 8 wherein:

said third subgroup of lenses has a focal length $f_{23}$; and $$0.02 \leqq |f_{23}/L| \leqq 0.10.$$

21. The projection optical system of claim 20 wherein:

said first group of lenses, said first subgroup of lenses in said second group of lenses, and said second subgroup of lenses in said second group of lenses have a composite focal length $f_a$; and $$4 \leqq |f_a/f_{23}|.$$

22. The projection optical system of claim 21 wherein:

the $i^{th}$ subgroup of lenses of said second group of lenses, in light path order from said object surface, has a focal length $f_{2i}$; and $$-50 \leqq (L/f_1)+(L/f_1)+\Sigma(L/f_{2i}) \leqq 0.5.$$

23. The projection optical system of claim 1 wherein:

said first group of lenses, said first subgroup of lenses in said second group of lenses, and said second subgroup of lenses in said second group of lenses have a composite focal length fa; and $$4 \leqq |fa/f_{23}|.$$

24. The projection optical system of claim 23 wherein:

the $i^{th}$ subgroup of lenses of said second group of lenses, in light path order from said object surface, has a focal length $f_{2i}$; and $$-50 \leqq (L/f_1)+(L/f_3)+\Sigma(L/f_{2i}) \leqq 0.5.$$

25. The projection optical system of claim 1 wherein:

the $i^{th}$ subgroup of lenses of said second group of lenses, in light path order from said object surface, has a focal length $f_{21}$; and $$-50 \leqq (L/f_1)+(L/f_3)+\Sigma(L/f_{2i}) \leqq 0.5.$$

26. An exposure method for exposing a predetermined pattern formed on a mask onto a substrate by using the projection optical system of claim 1, the method comprising the steps of:

illuminating the mask in said object surface with light of a predetermined exposure wavelength; and projecting an image of said pattern formed on said mask onto said substrate in said image surface through said projection optical system.

27. The exposure method of claim 26 wherein said predetermined pattern formed on said mask is an integrated circuit pattern.

28. An exposure method for exposing a predetermined pattern formed on a mask onto a substrate by using the projection optical system of claim 6, the method comprising the steps of:

illuminating the mask in said object surface with light of a predetermined exposure wavelength; and projecting an image of said pattern formed on said mask onto said substrate in said image surface through said projection optical system.

29. The exposure method of claim 28 wherein said predetermined pattern formed on said mask is an integrated circuit pattern.

30. An exposure method for exposing a predetermined pattern formed on a mask onto a substrate by using the projection optical system of claim 11, the method comprising the steps of:

illuminating the mask in said object surface with light of a predetermined exposure wavelength; and projecting an image of said pattern formed on said mask onto said substrate in said image surface through said projection optical system.

31. The exposure method of claim 30 wherein said predetermined pattern formed on said mask is an integrated circuit pattern.

32. An exposure method for exposing a predetermined pattern formed on a mask onto a substrate by using the projection optical system of claim 14, the method comprising the steps of:

illuminating the mask in said object surface with light of a predetermined exposure wavelength; and projecting an image of said pattern formed on said mask onto said substrate in said image surface through said projection optical system.

33. The exposure method of claim 32 wherein said predetermined pattern formed on said mask is an integrated circuit pattern.

34. An exposure method for exposing a predetermined pattern formed on a mask onto a substrate by using the projection optical system of claim 16, the method comprising the steps of:

illuminating the mask in said object surface with light of a predetermined exposure wavelength; and projecting an image of said pattern formed on said mask onto said substrate in said image surface through said projection optical system.

35. The exposure method of claim 34 wherein said predetermined pattern formed on said mask is an integrated circuit pattern.

36. An exposure method for exposing a predetermined pattern formed on a mask onto a substrate by using the projection optical system of claim 19, the method comprising the steps of:

illuminating the mask in said object surface with light of a predetermined exposure wavelength; and projecting an image of said pattern formed on said mask onto said substrate in said image surface through said projection optical system.

37. The exposure method of claim 36 wherein said predetermined pattern formed on said mask is an integrated circuit pattern.

38. An exposure method for exposing a predetermined pattern formed on a mask onto a substrate by using the projection optical system of claim 22, the method comprising the steps of:

illuminating the mask in said object surface with light of a predetermined exposure wavelength; and projecting an image of said pattern formed on said mask onto said substrate in said image surface through said projection optical system.

39. The exposure method of claim 38 wherein said predetermined pattern formed on said mask is an integrated circuit pattern.

40. An exposure method for exposing a predetermined pattern formed on a mask onto a substrate by using the projection optical system of claim 24, the method comprising the steps of:

illuminating the mask in said object surface with light of a predetermined exposure wavelength; and projecting an image of said pattern formed on said mask onto said substrate in said image surface through said projection optical system.

41. The exposure method of claim 40 wherein said predetermined pattern formed on said mask is an integrated circuit pattern.

42. An exposure method for exposing a predetermined pattern formed on a mask onto a substrate by using the projection optical system of claim 7, the method comprising the steps of:

illuminating the mask in said object surface with light of a predetermined exposure wavelength; and projecting an image of said pattern formed on said mask onto said substrate in said image surface through said projection optical system.

43. The exposure method of claim 42 wherein said predetermined pattern formed on said mask is an integrated circuit pattern.

44. Exposure apparatus comprising:

an illumination system that illuminates a first object having an object surface on which a fixed pattern is formed;

a projection optical system which projects an image of said fixed pattern onto an image surface on a second object;

a first supporting unit that supports said first object;

a second supporting unit that supports said second object; and said projection optical system comprising, in light path order from said object surface:

a first group of lenses with positive refractive power, said first group including at least two positive lenses;

a second group of lenses forming an approximately afocal system, said second group including, in light path order from said object surface, a first subgroup of lenses with negative refractive power, said first subgroup including at least two negative lenses, a second subgroup of lenses with positive refractive power, said second subgroup including at least four positive lenses, and a third subgroup of lenses with negative refractive power, said third subgroup including at least two negative lenses; and a third group of lenses with positive refractive power, said third group including at least two positive lenses;

wherein:

said projection optical system has an optical axis, said projection optical system has a focal length F.

said projection optical system has a projection magnification B, said object surface and said image surface are separated by a distance L, a ray from said image surface that is parallel to said optical axis and is incident on said projection optical system emerges from said projection optical system along a path and encounters said object surface at a height h from said optical axis, said ray has an extension along said path, which extension crosses said optical axis at a distance e from said object surface, 1. $8 \leqq |F/(B \cdot L)|$, and $|h/e| \leqq 3/1000$.

45. The exposure apparatus of claim 44 wherein said second group of lenses further comprises a fourth subgroup of lenses with positive refractive power.

46. The exposure apparatus of claim 45 wherein said fourth subgroup of lenses comprises at least two positive lenses.

47. The exposure apparatus of claim 44 wherein:

a maximum height of the object from said optical axis is represented by H; and $|B \bullet H/F| \leqq 8/1000$.

48. The exposure apparatus of claim 44 wherein:

$F \bullet h/(B \bullet H \bullet e) \leqq 4$.

49. The exposure apparatus of claim 44 wherein:

said first group of lenses has a focal length f1;

said third group of lenses has a focal length f3; and $$0.80 \leqq |f3/f1| \leqq 1.5.$$

50. The exposure apparatus of claim 44 wherein: $0.05 \leqq f_1/L \leqq 0.3$.

51. The exposure apparatus of claim 44 wherein: $0.03 \leqq H/L \leqq 0.2$.

52. The exposure apparatus of claim 44 wherein at least one of said first, second, and third groups of lenses in said projection optical system includes an aspherical lens.

53. A projection optical system that projects an image of an object in an object surface onto an image surface with a predetermined reduction magnification comprising, in light path order from said object surface:

a first group of lenses with positive refractive power, said first group including at least two positive lenses;

a second group of lenses forming an approximately afocal system, said second group including, in light path order from said object surface, a first subgroup of lenses with negative refractive power, said first subgroup including at least two negative lenses, a second subgroup of lenses with positive refractive power, said second subgroup including at least four positive lenses, and a third subgroup of lenses with negative refractive power, said third subgroup including at least two negative lenses; and a third group of lenses with positive refractive power, said third group including at least two positive lenses;

wherein at least one of said first, second, and third groups of lenses includes an aspherical lens.

54. An exposure method for exposing a predetermined pattern formed on a mask onto a substrate by using the projection optical system according to claim 53, the method comprising the steps of:

illuminating the mask in said object surface with light of a predetermined exposure wavelength; and projecting an image of said pattern formed on said mask onto said substrate in said image surface through said projection optical system.

55. The exposure method of claim 54 wherein said predetermined pattern formed on said mask is an integrated circuit pattern.

56. Exposure apparatus comprising the projection optical system according to claim 53 for exposing a predetermined pattern formed on a mask onto a substrate through the projection optical system, the exposure apparatus comprising:

an illumination system that illuminates the mask in said object surface with light of a predetermined exposure wavelength;

a first supporting unit that supports said mask; and a second supporting unit that supports said substrate.

57. The projection optical system of claim 53 wherein said second group of lenses further comprises a fourth subgroup of lenses with positive refractive power, said fourth subgroup including at least two positive lenses.

58. An exposure method for exposing a predetermined pattern formed on a mask onto a substrate by using the projection optical system according to claim 57, the method comprising the steps of:

illuminating the mask in said object surface with light of a predetermined exposure wavelength; and projecting an image of said pattern formed on said mask onto said substrate in said image surface through said projection optical system.

59. The exposure method of claim 58 wherein said predetermined pattern formed on said mask is an integrated circuit pattern.

60. Exposure apparatus comprising the projection optical system according to claim 57 for exposing a predetermined pattern formed on a mask onto a substrate through the projection optical system, the exposure apparatus comprising:

an illumination system that illuminates the mask in said object surface with light of a predetermined exposure wavelength;

a first supporting unit that supports said mask; and a second supporting unit that supports said substrate.

61. The projection optical system of claim 57 wherein:

said object surface and said image surface are separated by a distance L;

said first group of lenses has a focal length $f_1$; and $0.05 \leqq f_1/L \leqq 0.3$.

62. An exposure method for exposing a predetermined pattern formed on a mask onto a substrate by using the projection optical system according to claim 61, the method comprising the steps of:

illuminating the mask in said object surface with light of a predetermined exposure wavelength; and projecting an image of said pattern formed on said mask onto said substrate in said image surface through said projection optical system.

63. The exposure method of claim 62 wherein said predetermined pattern formed on said mask is an integrated circuit pattern.

64. Exposure apparatus comprising the projection optical system according to claim 61 for exposing a predetermined pattern formed on a mask onto a substrate through the projection optical system, the exposure apparatus comprising:

an illumination system that illuminates the mask in said object surface with light of a predetermined exposure wavelength;

a first supporting unit that supports said mask; and a second supporting unit that supports said substrate.

65. The projection optical system of claim 53, wherein:

said aspherical lens has a rotationally symmetric aspherical surface with respect to an optical axis of said aspherical lens; and said rotationally symmetric aspherical surface is formed as a consecutive refractive surface.

66. An exposure method for exposing a predetermined pattern formed on a mask onto a substrate by using the projection optical system according to claim 65, the method comprising the steps of:

illuminating the mask in said object surface with light of a predetermined exposure wavelength; and projecting an image of said pattern formed on said mask onto said substrate in said image surface through said projection optical system.

67. The exposure method of claim 66 wherein said predetermined pattern formed on said mask is an integrated circuit pattern.

68. Exposure apparatus comprising the projection optical system according to claim 65 for exposing a predetermined pattern formed on a mask onto a substrate through the projection optical system, the exposure apparatus comprising:

an illumination system that illuminates the mask in said object surface with light of a predetermined exposure wavelength;

a first supporting unit that supports said mask; and a second supporting unit that supports said substrate.

69. The projection optical system of claim 65, wherein:

said first subgroup of lenses has a focal length $f_{21}$;

said second subgroup of lenses has a focal length $f_{22}$; and $$1.5 \leqq |f_{22}/f_{21}| \leqq 5.$$

70. An exposure method for exposing a predetermined pattern formed on a mask onto a substrate by using the projection optical system according to claim 69, the method comprising the steps of:

illuminating the mask in said object surface with light of a predetermined exposure wavelength; and projecting an image of said pattern formed on said mask onto said substrate in said image surface through said projection optical system.

71. The exposure method of claim 70 wherein said predetermined pattern formed on said mask is an integrated circuit pattern.

72. Exposure apparatus comprising the projection optical system according to claim 69 for exposing a predetermined pattern formed on a mask onto a substrate through the projection optical system, the exposure apparatus comprising:

an illumination system that illuminates the mask in said object surface with light of a predetermined exposure wavelength;

a first supporting unit that supports said mask; and a second supporting unit that supports said substrate.

73. The projection optical system of claim 69, wherein:

said first group of lenses has a focal length $f_1$;

said object surface and said image surface are separated by a distance L; and $$0.05 \leqq f_1/L \leqq 0.3.$$

74. An exposure method for exposing a predetermined pattern formed on a mask onto a substrate by using the projection optical system according to claim 73, the method comprising the steps of:

illuminating the mask in said object surface with light of a predetermined exposure wavelength; and projecting an image of said pattern formed on said mask onto said substrate in said image surface through said projection optical system.

75. The exposure method of claim 74 wherein said predetermined pattern formed on said mask is an integrated circuit pattern.

76. Exposure apparatus comprising the projection optical system according to claim 73 for exposing a predetermined pattern formed on a mask onto a substrate through the projection optical system, the exposure apparatus comprising:

an illumination system that illuminates the mask in said object surface with light of a predetermined exposure wavelength;

a first supporting unit that supports said mask; and a second supporting unit that supports said substrate.

*77. A projection optical system that projects an image of a pattern formed on a reticle onto a substrate with a predetermined magnification comprising, in the light path order from the reticle:*

*a first group with positive refractive power, said first group comprising at least two positive lenses;*

*a second group comprising at least four positive lenses and at least four negative lenses;*

*a third group positive refractive power, said third group comprising at least two positive lenses; and*

*at least one aspherical surface included in at least one of said first, second, and/or third group,*

*wherein the projection optical system has a numerical aperture not less than 0.56.*

*78. A projection optical system according to claim 77, wherein said at least one aspherical surface has, substantially, a rotationally symmetric shape about an optical axis.*

*79. A projection optical system according to claim 77, wherein the at least four negative lenses in said second group have concave surfaces formed opposite to each other.*

*80. A projection optical system according to claim 77, wherein said at least four negative lenses in said second group comprise concave surfaces, and*

*wherein the at least four negative lenses of said second group comprise*

*a first pair of negative lenses wherein the concave surfaces are formed opposed to each other, and*

*a second pair of negative lenses wherein the concave surfaces are formed opposed to each other.*

*81. A projection optical system according to claim 77, wherein the at least two positive lenses of said first group are formed with convex surfaces facing the substrate.*

*82. A projection optical system according to claim 77, wherein the at least two positive lenses of said third group are formed with convex surfaces facing the reticle.*

*83. A projection optical system according to claim 77, wherein said at least one aspherical surface includes an aspherical refractive surface.*

*84. A projection optical system according to claim 77, wherein the lenses in said first, second, and third group comprise non-cemented single lenses.*

*85. A projection optical system according to claim 79, wherein the at least two positive lenses in said third group have convex surfaces facing the reticle.*

*86. A projection optical system according to claim 85, wherein said at least one aspherical surface has, substantially, a rotationally symmetric shape about an optical axis.*

*87. A projection optical system according to claim 85, wherein the at least two positive lenses in said first group have convex surfaces facing the reticle.*

*88. A projection optical system according to claim 87, wherein said at least one aspherical surface has, substantially, a rotationally symmetric shape about an optical axis.*

*89. A projection optical system according to claim 87, wherein said third group further comprises a negative lens with a concave lens surface facing the substrate.*

*90. A projection optical system according to claim 89, wherein said at least one aspherical surface has, substantially, a rotationally symmetric shape about an optical axis.*

*91. A projection optical system according to claim 77, wherein the lenses in said first, second, and third group comprise non-cemented single lenses.*

*92. An exposure apparatus comprising:*

*a projection optical system that projects a pattern image of a reticle onto a substrate, according to claim 77;*

*an illumination system that illuminates the reticle with a light having a predetermined wavelength;*

*a first stage that supports the reticle; and*

*a second stage that supports the substrate.*

*93. An exposure apparatus comprising:*

*a projection optical system that projects a pattern image of a reticle on a substrate, according to claim 78;*

*an illumination system that illuminates the reticle with a light having a predetermined wavelength;*

*a first stage that supports the reticle; and*

*a second stage that supports the substrate.*

*94. An exposure apparatus comprising:*

*a projection optical system that projects a pattern image of a reticle on a substrate, according to claim 79;*

*an illumination system that illuminates the reticle with a light having a predetermined wavelength;*

*a first stage that supports the reticle; and*

*a second stage that supports the substrate.*

*95. An exposure apparatus comprising:*

*a projection optical system that projects a pattern image of a reticle on a substrate, according to claim 80;*

*an illumination system that illuminates the reticle with a light having a predetermined wavelength;*

*a first stage that supports the reticle; and*

*a second stage that supports the substrate.*

*96. An exposure apparatus comprising:*

*a projection optical system that projects a pattern image of a reticle on a substrate, according to claim 81;*

*an illumination system that illuminates the reticle with a light having a predetermined wavelength;*

*a first stage that supports the reticle; and*

*a second stage that supports the substrate.*

*97. An exposure apparatus comprising:*

*a projection optical system that projects a pattern image of a reticle on a substrate, according to claim 82;*

*an illumination system that illuminates the reticle with a light having a predetermined wavelength;*

*a first stage that supports the reticle; and*

*a second stage that supports the substrate.*

*98. An exposure apparatus comprising:*

*a projection optical system that projects a pattern image of a reticle on a substrate, according to claim 83;*

*an illumination system that illuminates the reticle with a light having a predetermined wavelength;*

*a first stage that supports the reticle; and*

*a second stage that supports the substrate.*

*99. An exposure apparatus comprising:*

*a projection optical system that projects a pattern image of a reticle on a substrate, according to claim 86;*

*an illumination system that illuminates the reticle with a light having a predetermined wavelength;*

*a first stage that supports the reticle; and*

*a second stage that supports the substrate.*

*100. An exposure apparatus comprising:*

*a projection optical system that projects a pattern image of a reticle on a substrate, according to claim 88;*

*an illuminating system that illuminates the reticle with a light having a predetermined wavelength;*

*a first stage that supports the reticle; and*

*a second stage that supports the substrate.*

*101. An exposure apparatus comprising:*

*a projection optical system that projects a pattern image of a reticle on a substrate, according to claim 90;*

*an illumination system that illuminates the reticle with a light having a predetermined wavelength;*

*a first stage that supports the reticle; and*

*a second stage that supports the substrate.*

*102. An exposure method of projecting a pattern of a reticle on a substrate comprising:*

*illuminating the reticle with a light having a predetermined wavelength; and*

*projecting a pattern image of the reticle onto the substrate through a projection optical system according to claim 77.*

*103. An exposure method of projecting a pattern of a reticle on a substrate comprising:*

*illuminating the reticle with a light having a predetermined wavelength; and*

*projecting a pattern image of the reticle onto the substrate through a projection optical system according to claim 78.*

*104. An exposure method of projecting a pattern of a reticle on a substrate comprising:*

*illuminating the reticle with a light having a predetermined wavelength; and*

*projecting a pattern image of the reticle onto the substrate through a projection optical system according to claim 79.*

*105. An exposure method of projecting a pattern of a reticle on a substrate comprising:*

*illuminating the reticle with a light having a predetermined wavelength; and*

*projecting a pattern image of the reticle onto the substrate through a projection optical system according to claim 80.*

*106. An exposure method of projecting a pattern of a reticle on a substrate comprising:*

*illuminating the reticle with a light having a predetermined wavelength; and*

*projecting a pattern image of the reticle onto the substrate through a projection optical system according to claim 81.*

*107. An exposure method of projecting a pattern of a reticle on a substrate comprising:*

*illuminating the reticle with a light having a predetermined wavelength; and*

*projecting a pattern image of the reticle onto the substrate through a projection optical system according to claim 82.*

*108. An exposure method of projecting a pattern of a reticle on a substrate comprising:*

*illuminating the reticle with a light having a predetermined wavelength; and*

*projecting a pattern image of the reticle onto the substrate through a projection optical system according to claim 83.*

*109. An exposure method of projecting a pattern of a reticle on a substrate comprising:*

*illuminating the reticle with a light having a predetermined wavelength; and*

*projecting a pattern image of the reticle onto the substrate through a projection optical system according to claim 86.*

*110. An exposure method of projecting a pattern of a reticle on a substrate comprising:*

*illuminating the reticle with a light having a predetermined wavelength; and*

*projecting a pattern image of the reticle onto the substrate through a projection optical system according to claim 88.*

*111. An exposure method of projecting a pattern of a reticle on a substrate comprising:*

*illuminating the reticle with a light having a predetermined wavelength; and*

*projecting a pattern image of the reticle onto the substrate through a projection optical system according to claim 90.*

*112. A projection optical system that projects an image of a pattern formed on a reticle onto a substrate comprising:*

*a first group with positive refractive power disposed in an optical path between the reticle and the substrate, said first group comprising at least two positive lenses;*

*a second group disposed in said optical path between said first group and the substrate, said second group comprising*

*a negative sub-group with negative refractive power which comprises at least two negative lenses,*

*a positive sub-group with positive refractive power which comprises at least two positive lenses, and*

*a stop arranged between the at least two postive lenses;*

*a third group with positive refractive power disposed in said optical path between said second group and the*

*substrate, said third group comprising at least two positive lenses; and*

*at least one aspherical surface included in at least one of said first, second, and/or third group,*

*wherein*

*the two negative lenses in said negative sub-group include concave surfaces formed opposed to each other, and*

*the projection optical system has a numerical aperture not less than 0.56.*

*113. A projection optical system according to claim 112, wherein said at least one aspherical surface has, substantially, a rotationally symmetric shape about an optical axis.*

*114. An exposure apparatus comprising:*

*a projection optical system that projects a pattern image of a reticle on a substrate, according to claim 112;*

*an illumination system that illuminates the reticle with a light having a predetermined wavelength;*

*a first stage that supports the reticle; and*

*a second stage that supports the substrate.*

*115. An exposure method of projecting a pattern of a reticle on a substrate comprising:*

*illuminating the reticle with a light having a predetermined wavelength; and*

*projecting a pattern image of the reticle onto the substrate through a projection optical system according to claim 112.*

*116. An exposure apparatus comprising:*

*a projection optical system that projects a pattern image of a reticle on a substrate, according to claim 113;*

*an illumination system that illuminates the reticle with a light having a predetermined wavelength;*

*a first stage that supports the reticle; and*

*a second stage that supports the substrate.*

*117. An exposure method of projecting a pattern of a reticle on a substrate comprising:*

*illuminating the reticle with a light having a predetermined wavelength; and*

*projecting a pattern image of the reticle onto the substrate through a projection optical system according to claim 113.*

*118. A projection optical system that projects an image of an object in an object surface onto an image surface with a predetermined reduction magnification comprising, in light path order from the object surface;*

*a first group of lenses with positive refractive power, said first group comprising at least two positive lenses;*

*a first subgroup of lenses with negative refractive power, the first subgroup comprising at least two negative lenses,*

*a second subgroup of lenses with positive refractive power, the second subgroup comprising at least four positive lenses, and*

*a third subgroup of lenses with negative refractive power, the third subgroup comprising at least two negative lenses;*

*a third group of lenses with positive refractive power, said third group comprising at least two positive lenses; and*

*at least one aspherical surface included in at least one of said first, second, and/or third group of lenses,*

*wherein the projection optical system has a numerical aperture not less than 0.56.*

*119. An exposure method for exposing a predetermined pattern formed on a mask onto a substrate comprising:*

*illuminating the mask in the object surface with light of a predetermined exposure wavelength; and*

*projecting an image of the predetermined formed on the mask onto the substrate in an image surface through a projection optical system according to claim 118.*

*120. An exposure apparatus comprising:*

*an illumination system that illuminates a mask in an object surface with a light of a predetermined exposure wavelength;*

*a projection optical system according to claim 118 that exposes a predetermined pattern formed on the mask onto a substrate;*

*a first supporting unit that supports the mask; and*

*a second supporting unit that supports the substrate.*

*121. A projection optical system according to claim 118, wherein said at least one aspherical surface has, substantially, a rotationally symmetric shape about an optical axis.*

*122. An exposure method for exposing a predetermined pattern formed on a mask onto a substrate comprising:*

*illuminating the mask in the object surface with a light of a predetermined exposure wavelength; and*

*projecting image of the predetermined pattern formed on the mask onto the substrate in an image surface through a projection optical system according to claim 121.*

*123. An exposure apparatus comprising:*

*an illumination system that illuminates a mask in an object surface with a light of predetermined exposure wavelength;*

*a projection optical system according to claim 121 to expose a predetermined pattern formed on the mask onto a substrate;*

*a first supporting unit that supports the mask; and*

*a second supporting unit that supports the substrate.*

*124. A projection optical system of claim 118, wherein said second group of lenses further comprises a fourth subgroup of lenses with positive refractive power, the fourth subgroup comprising at least two positive lenses.*

*125. An exposure method for exposing a predetermined pattern formed on a mask onto a substrate comprising:*

*illuminating the mask in an object surface with light of a predetermined exposure wavelength; and*

*projecting an image of the predetermined pattern formed on the mask onto the substrate in an image surface through a projection optical system according to claim 124.*

*126. An exposure apparatus that exposes a predetermined pattern formed on a mask onto a substrate comprising:*

*an illumination system that illuminates the mask in an object surface with a light of a predetermined exposure wavelength;*

*a projection optical system according to claim 124 to expose the predetermined pattern formed on the mask onto the substrate;*

*a first supporting unit that supports the mask; and*

*a second supporting unit that supports the substrate.*

*127. A projection optical system according to claim 124, wherein said at least one aspherical surface has, substantially, a rotationally symmetric shape about an optical axis.*

*128. An exposure method for exposing a predetermined pattern formed on a mask onto a substrate comprising:*

*illuminating the mask in an object surface with a light of a predetermined exposure wavelength; and*

*projecting an image of the predetermined pattern formed on the mask onto the substrate in an image surface through a projection optical system according to claim 127.*

*129. An exposure apparatus comprising:*

*an illumination system that illuminates a mask in an object surface with a light of a predetermined exposure wavelength;*

*a projection optical system according to claim 127 to expose a predetermined pattern formed on the mask onto a substrate in an image surface;*

*a first supporting unit that supports the mask; and*

*a second supporting unit that supports the substrate.*

*130. An exposure apparatus comprising:*

*a projection optical system that projects a pattern formed on a reticle onto a substrate, said projection system being telecentric on a reticle and a substrate side; and*

*an illumination system designed in accordance with the telecentricity of said projection optical system on the reticle side so as to illuminate the reticle,*

*wherein said projection optical system has a numerical aperture not less than 0.56 and comprises at least one aspherical surface.*

*131. An exposure apparatus according to claim 130, wherein the at least one aspherical surface includes an aspherical refractive surface.*

*132. An exposure apparatus according to claim 131, wherein the at least one aspherical surface has a substantially rotationally symmetric shape about an optical axis.*

*133. An exposure means according to claim 130, wherein said projection system comprises in light path order from the reticle;*

*a first group with positive refractive power, the first group comprising at least two positive lenses;*

*a second group comprising at least four positive lenses and at least four negative lenses; and*

*a third group with positive refractive power, the third group comprising at least two positive lenses.*

*134. An exposure apparatus according to claim 133, wherein the at least one aspherical surface is included in at least one of said first, second, and/or third group.*

*135. An exposure method using an exposure apparatus of claim 130, comprising:*

*illuminating a reticle with a light having a predetermined wavelength using the illumination system; and*

*projecting a pattern of the reticle onto a substrate using the projection system.*

*136. An exposure method using an exposure apparatus according to claim 131, comprising:*

*illuminating a reticle with a light having a predetermined wavelength using the illumination system; and*

*projecting a pattern of the reticle onto a substrate using the projection system.*

*137. An exposure method using an exposure apparatus according to claim 132, comprising:*

*illuminating a reticle with a light having a predetermined wavelength using the illumination system; and*

*projecting a pattern of the reticle onto a substrate using the projection system.*

*138. An exposure method using an exposure apparatus according to claim 133, comprising:*

*illuminating a reticle with a light having a predetermined wavelength using the illumination system; and*

*projecting a pattern of the reticle onto a substrate using the projection system.*

*139. An exposure method using an exposure apparatus according to claim 134, comprising:*

*illuminating a reticle with a light having a predetermined wavelength using the illumination system; and*

*projecting a pattern of the reticle onto a substrate using the projection system.*

*140. A method of manufacturing an exposure apparatus comprising:*

*preparing a projection system that projects a pattern formed on a reticle onto a substrate, said preparing the projection system comprising forming at least one aspherical surface in the projection system with the projection system being telecentric on a reticle and a substrate side and having a numerical aperture not less than 0.56; and*

*preparing an illumination system designed in accordance with a telecentricity of the projection system on the reticle side so as to illuminate the reticle.*

*141. A method according to claim 140, wherein the at least one aspherical surface includes an aspherical refractive surface.*

*142. A method according to claim 140, wherein the at least one aspherical surface has a substantially rotationally symmetric shape about an optical axis.*

*143. A method according to claim 140, wherein said preparing the projecting system comprises*

*arranging a first group with positive refractive power in a light path between the reticle and the substrate, the first group comprising at least two positive lenses;*

*arranging a second group comprising at least four positive lenses and at least four negative lenses in a light path between the first group and the substrate; and*

*arranging a third group with positive refractive power in a light path between the second group and the substrate, the third group comprising at least two positive lenses.*

*144. A method according to claim 143, wherein the at least one aspherical surface is included in at least one of the first, second, and/or third groups.*

*145. An exposure method comprising:*

*preparing a projection system that projects a pattern formed on a reticle onto a substrate, the projection system being telecentric on a reticle side and a substrate side, having a numerical aperture not less than 0.56, and comprising at least one aspherical surface;*

*preparing an illumination system designed in accordance with a telecentricity of the projection system on the reticle side;*

*illuminating the reticle using the illumination system; and*

*projecting a pattern of the reticle onto the substrate using the projection system.*

*146. An exposure method according to claim 145, wherein the at least one aspherical surface includes an aspherical refractive surface.*

*147. An exposure method according to claim 145, wherein the at least one aspherical surface has a substantially rotationally symmetric shape about an optical axis.*

*148. An exposure method according to claim 145, wherein said preparing the projection system comprises*

*arranging a first group with positive refractive power in a light path between the reticle and the substrate, the first group comprising at least two positive lenses;*

*arranging a second group comprising at least four positive lenses and at least four negative lenses in a light path between the first group and the substrate; and*

*arranging a third group with positive refractive power in a light path between the second group and the substrate, the third group comprising at least two positive lenses.*

*149. An exposure method according to claim 148, wherein the at least one aspherical surface is included in at least one of the first, second, and/or third groups.*

*150. An exposure apparatus comprising:*

*a projection system that projects a pattern formed on a reticle onto a substrate, said projection system comprising an optical performance, said projection system having a numerical aperture not less than 0.56 and comprising at least one aspherical surface; and*

*an illumination system designed in accordance with the optical performance of said projection system so as to illuminate the reticle.*

*151. An exposure apparatus according to claim 150, wherein the at least one aspherical surface comprises an aspherical refractive surface.*

*152. An exposure method comprising:*

*preparing a projection system that projects a pattern formed on a reticle onto a substrate, the projection system comprising an optical performance, the projection system having a numerical aperture not less than 0.56 and comprising at least one aspherical surface;*

*preparing an illumination system designed in accordance with the optical performance of the projection system so to illuminate system; and*

*projecting the pattern of the reticle onto the substrate using the projection system.*

*153. A method according to claim 152, wherein the at least one aspherical surface comprises an aspherical refractive surface.*

*154. A method of manufacturing an exposure apparatus comprising:*

*preparing a projection system that projects a pattern formed on a reticle onto a substrate, the projection system having a numerical aperture not less than 0.56 and comprising at least one aspherical surface; and*

*preparing an illumination system designed in accordance with an optical performance of the projection system to illuminate the reticle.*

*155. A method according to claim 154, wherein the at least one aspherical surface comprises an aspherical refractive surface.*

*156. A projection optical system that projects an image of a pattern formed on a reticle onto a substrate with a predetermined magnification, comprising:*

*a first group of lenses with a positive refractive power arranged in an optical path between the reticle and the substrate and which comprises at least two positive lenses;*

*a second group of lenses arranged in an optical path between the reticle and the first group of lenses and which comprises at least four positive lenses and at least four negative lenses; and*

*at least one aspherical surface included in at least one of the first group and the second group of lenses,*

*wherein the projection optical system has a numerical aperture not less than 0.56.*

*157. A projection optical system according to claim 156, wherein the at least one aspherical surface includes an aspherical refractive surface.*

*158. A projection optical system according to claim 156, wherein the at least four negative lenses in the second group of lenses comprise concave surfaces formed opposite to each other.*

*159. A projection optical system according to claim 158, wherein the at least two positive lenses in the first group of lenses have convex surfaces facing the reticle.*

*160. A projection optical system according to claim 159, wherein the at least one aspherical surface includes an aspherical refractive surface.*

*161. A projection optical system according to claim 160, further comprising an additional group of lenses which is arranged in an optical path between the reticle and the second group of lenses and which comprises at least two positive lenses.*

*162. A projection optical system according to claim 156, wherein the at least four negative lenses in the second group of lenses comprise a first pair of negative lenses with concave surfaces opposite to each other, and a second pair of negative lenses with concave surfaces opposite to each other.*

*163. A projection optical system according to claim 156, wherein the second group of lenses comprises:*

*a first subgroup of lenses with a negative refractive power arranged in the optical path between the reticle and the first group of lenses and which comprises at least two negative lenses;*

*a second subgroup of lenses with a positive refractive power arranged in an optical path between the reticle and the first subgroup of lenses and which comprises at least two positive lenses, and*

*a third subgroup of lenses with a negative refractive power arranged in an optical path between the reticle and the second subgroup of lenses and which comprises at least two negative lenses.*

*164. A projection optical system according to claim 163, wherein the second group of lenses further comprises:*

*an additional subgroup of lenses with a positive refractive power arranged in an optical path between the first subgroup of lenses and the first group of lenses and which comprises at least two positive lenses.*

*165. A projection optical system according to claim 163, wherein the third subgroup of lenses comprises concave surfaces opposite to each other.*

*166. A projection optical system according to claim 165, wherein the first subgroup of lenses comprises concave surfaces opposite to each other.*

*167. A projection optical system according to claim 166, further comprising an additional group of lenses arranged in an optical path between the reticle and the second group of lenses and which comprises at least two positive lenses.*

*168. A projection optical system according to claim 156, wherein the at least two positive lenses in the first group of lenses have convex surfaces facing the reticle.*

*169. A projection optical system according to claim 156, wherein the lenses in the first and second group of lenses comprise non-cemented lenses.*

*170. An exposure apparatus comprising:*

*a projection optical system that projects a pattern image of a reticle onto a substrate, according to claim 157;*

*an illumination system that illuminates the reticle with a light having a predetermined wavelength;*

*a first stage that supports the reticle; and*

*a second stage that supports the substrate.*

*171. An exposure apparatus comprising:*

*a projection optical system that projects a pattern image of a reticle onto a substrate, according to claim 158;*

*an illumination system that illuminates the reticle with a light having a predetermined wavelength;*

*a first stage that supports the reticle; and*

*a second stage that supports the substrate.*

*172. An exposure apparatus comprising:*

*a projection optical system that projects a pattern image of a reticle onto a substrate, according to claim 159;*

*an illumination system that illuminates the reticle with a light having a predetermined wavelength;*

*a first stage that supports the reticle; and*

*a second stage that supports the substrate.*

*173. An exposure apparatus comprising:*

*a projection optical system that projects a pattern image of a reticle onto a substrate, according to claim 160;*

*an illumination system that illuminates the reticle with a light having a predetermined wavelength;*

*a first stage that supports the reticle; and*

*a second stage that supports the substrate.*

*174. An exposure apparatus comprising:*

*a projection optical system that projects a pattern image of a reticle onto a substrate, according to claim 162;*

*an illumination system that illuminates the reticle with a light having a predetermined wavelength;*

*a first stage that supports the reticle; and*

*a second stage that supports the substrate.*

*175. An exposure apparatus comprising:*

*a projection optical system that projects a pattern image of a reticle onto a substrate, according to claim 163;*

*an illumination system that illuminates the reticle with a light having a predetermined wavelength;*

*a first stage that supports the reticle; and*

*a second stage that supports the substrate.*

*176. An exposure apparatus comprising:*

*a projection optical system that projects a pattern image of a reticle onto a substrate, according to claim 164;*

*an illumination system that illuminates the reticle with a light having a predetermined wavelength;*

*a first stage that supports the reticle; and*

*a second stage that supports the substrate.*

*177. An exposure apparatus comprising:*

*a projection optical system that projects a pattern image of a reticle onto a substrate, according to claim 165;*

*an illumination system that illuminates the reticle with a light having a predetermined wavelength;*

*a first stage that supports the reticle; and*

*a second stage that supports the substrate.*

*178. An exposure apparatus comprising:*

*a projection optical system that projects a pattern image of a reticle onto a substrate, according to claim 166;*

*an illumination system that illuminates the reticle with a light having a predetermined wavelength;*

*a first stage that supports the reticle; and*

*a second stage that supports the substrate.*

*179. An exposure apparatus comprising:*

*a projection optical system that projects a pattern image of a reticle onto a substrate, according to claim 168;*

*an illumination system that illuminates the reticle with a light having a predetermined wavelength;*

*a first stage that supports the reticle; and*

*a second stage that supports the substrate.*

*180. An exposure apparatus comprising:*

*a projection optical system that projects a pattern image of a reticle onto a substrate, according to claim 156;*

*an illumination system that illuminates the reticle with a light having a predetermined wavelength;*

*a first stage that supports the reticle; and*

*a second stage that supports the substrate.*

*181. An exposure method of projecting a pattern of a reticle onto a substrate comprising:*

*illuminating the reticle with a light having a predetermined wavelength; and*

*projecting a pattern image of the reticle onto the substrate through a projection optical system according to claim 157.*

*182. An exposure method of projecting a pattern of a reticle onto a substrate comprising:*

*illuminating the reticle with a light having a predetermined wavelength; and*

*projecting a pattern image of the reticle onto the substrate through a projection optical system according to claim 158.*

*183. An exposure method of projecting a pattern of a reticle onto a substrate comprising:*

*illuminating the reticle with a light having a predetermined wavelength; and*

*projecting a pattern image of the reticle onto the substrate through a projection optical system according to claim 159.*

*184. An exposure method of projecting a pattern of a reticle onto a substrate comprising:*

*illuminating the reticle with a light having a predetermined wavelength; and*

*projecting a pattern image of the reticle onto the substrate through a projection optical system according to claim 160.*

*185. An exposure method of projecting a pattern of a reticle onto a substrate comprising:*

*illuminating the reticle with a light having a predetermined wavelength; and*

*projecting a pattern image of the reticle onto the substrate through a projection optical system according to claim 162.*

*186. An exposure method of projecting a pattern of a reticle onto a substrate comprising:*

*illuminating the reticle with a light having a predetermined wavelength; and*

*projecting a pattern image of the reticle onto the substrate through a projection optical system according to claim 163.*

*187. An exposure method of projecting a pattern of a reticle onto a substrate comprising:*

*illuminating the reticle with a light having a predetermined wavelength; and*

*projecting a pattern image of the reticle onto the substrate through a projection optical system according to claim 164.*

*188. An exposure method of projecting a pattern of a reticle onto a substrate comprising:*

*illuminating the reticle with a light having a predetermined wavelength; and*

*projecting a pattern image of the reticle onto the substrate through a projection optical system according to claim 165.*

*189. An exposure method of projecting a pattern of a reticle onto a substrate comprising:*

*illuminating the reticle with a light having a predetermined wavelength; and*

*projecting a pattern image of the reticle onto the substrate through a projection optical system according to claim 166.*

*190. An exposure method of projecting a pattern of a reticle onto a substrate comprising:*

*illuminating the reticle with a light having a predetermined wavelength; and*

*projecting a pattern image of the reticle onto the substrate through a projection optical system according to claim 168.*

*191. An exposure method of projecting a pattern of a reticle onto a substrate comprising:*

*illuminating the reticle with a light having a predetermined wavelength; and*

*projecting a pattern image of the reticle onto the substrate through a projection optical system according to claim 156.*

*192. An exposure apparatus according to claim 130, wherein the projection optical system comprises:*

*a first group of lenses with a positive refractive power arranged in an optical path between the reticle and the substrate and which comprises at least two positive lenses; and*

*a second group of lenses arranged in an optical path between the reticle and the first group of lenses and which comprises at least four positive lenses and at least four negative lenses.*

*193. An exposure apparatus according to claim 192, wherein the at least one aspherical surface includes an aspherical refractive surface.*

*194. An exposure method using an exposure apparatus according to claim 193, comprising:*

*illuminating a reticle with a light having a predetermined wavelength using the illumination system; and*

*projecting a pattern of the reticle onto a substrate using the projection optical system.*

*195. An exposure method using an exposure apparatus according to claim 192, comprising:*

*illuminating a reticle with a light having a predetermined wavelength using the illumination system, and*

*projecting a pattern of the reticle onto a substrate using the projection optical system.*

*196. A method according to claim 141, wherein the preparing the projection system comprises:*

*arranging a first group of lenses with a positive refractive power in an optical path between the reticle and the substrate, the first group of lenses comprising at least two positive lenses; and*

*arranging a second group of lenses in an optical path between the reticle and the first group of lenses, the second group of lenses comprising at least four negative lenses and at least four positive lenses.*

*197. A method according to claim 196, wherein the arranging the second group of lenses comprises:*

*arranging a first subgroup of lenses with a negative refractive power in the optical path between the reticle and the first group of lenses, the first subgroup of lenses comprising at least two negative lenses:*

*arranging a second subgroup of lenses with a positive refractive power in an optical path between the reticle and the first subgroup of lenses, the second subgroup of lenses comprising at least two positive lenses; and*

*arranging a third subgroup of lenses with a negative refractive power in an optical path between the reticle and the second subgroup of lenses, the third subgroup of lenses comprising at least two negative lenses.*

*198. An exposure apparatus manufactured by the method according to claim 196.*

*199. An exposure apparatus manufactured by the method according to claim 197.*

*200. An exposure apparatus manufactured by the method according to claim 141.*

*201. An exposure apparatus manufactured by the method according to claim 143.*

*202. An exposure apparatus manufactured by the method according to claim 144.*

*203. An exposure apparatus manufactured by the method according to claim 140.*

*204. An exposure method according to claim 148, wherein the preparing the projection system comprises forming at least one aspherical surface in the projection optical system.*

*205. An exposure method according to claim 145, wherein the preparing the projection system comprises:*

*arranging a first group of lenses with a positive refractive power in an optical path between the reticle and the substrate, the first group of lenses comprising at least two positive lenses; and*

*arranging a second group of lenses in an optical path between the reticle and the first group of lenses, the second group of lenses comprising at least four negative lenses and at least four positive lenses.*

*206. An exposure method according to claim 205, wherein the arranging the second group of lenses comprises:*

*arranging a first subgroup of lenses with a negative refractive power in the optical path between the reticle and the first group of lenses, the first subgroup of lenses comprising at least two positive lenses;*

*arranging a second subgroup of lenses with a positive refractive power in an optical path between the reticle and the first subgroup of lenses, the second subgroup of lenses comprising at least two positive lenses; and*

*arranging a third subgroup of lenses with a negative refractive power in an optical path between the reticle and the second subgroup of lenses, the third subgroup of lenses comprising at least two negative lenses.*

*207. An exposure method according to claim 206, wherein the preparing the projection system comprises forming at least one aspherical surface in the projection system.*

* * * * *

UNITED STATES PATENT AND TRADEMARK OFFICE

CERTIFICATE OF CORRECTION

PATENT NO. : RE 38,403 E
DATED : January 27, 2004
INVENTOR(S) : Toshihiro Sasaya et al.

It is certified that error appears in the above-identified patent and that said Letters Patent is hereby corrected as shown below:

Column 41,
Lines 27 and 42, change “onto” to -- on --;
After line 50, insert paragraph -- a second group of lenses comprising, in light path order from the object surface, --.

Column 42,
Line 3, after “predetermined”, insert -- pattern --.

Column 45,
Line 27, after “illuminate” insert -- the reticle; --, insert paragraph; -- illuminating the reticle using the illumination --.

Signed and Sealed this

Thirteenth Day of July, 2004

JON W. DUDAS
*Acting Director of the United States Patent and Trademark Office*